US012563897B2

(12) United States Patent
Choi et al.

(10) Patent No.: US 12,563,897 B2
(45) Date of Patent: Feb. 24, 2026

(54) DISPLAY PANEL

(71) Applicant: Samsung Display Co., Ltd., Yongin-si (KR)

(72) Inventors: Yoonsun Choi, Yongin-si (KR); Hyunchul Kim, Yongin-si (KR); Seongryong Lee, Yongin-si (KR); Eunae Jung, Yongin-si (KR); Wonsuk Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/828,521

(22) Filed: Sep. 9, 2024

(65) Prior Publication Data

US 2024/0431138 A1     Dec. 26, 2024

Related U.S. Application Data

(63) Continuation of application No. 18/352,470, filed on Jul. 14, 2023, now Pat. No. 12,108,623, which is a
(Continued)

(30) Foreign Application Priority Data

Nov. 21, 2018    (KR) ........................ 10-2018-0144678

(51) Int. Cl.
　　*H10K 59/121*　　　(2023.01)
　　*G06F 3/041*　　　(2006.01)
(Continued)

(52) U.S. Cl.
　　CPC ......... *H10K 59/121* (2023.02); *G06F 3/0412* (2013.01); *G06F 3/042* (2013.01);
(Continued)

(58) Field of Classification Search
None
See application file for complete search history.

(56) References Cited

U.S. PATENT DOCUMENTS 10,205,122 B2 *　2/2019　Choi ..................... H10K 59/124
10,541,380 B1 *　1/2020　Sung ..................... H10K 50/844
(Continued)

FOREIGN PATENT DOCUMENTS

CN　　106409867　　2/2017
CN　　107783691　　3/2018
(Continued)

*Primary Examiner* — Patrick N Edouard
*Assistant Examiner* — Peijie Shen
(74) *Attorney, Agent, or Firm* — F. CHAU & ASSOCIATES, LLC

(57) ABSTRACT

A display panel includes a substrate including an opening area, a display area, and a first non-display area, the first non-display area being between the opening area and the display area, a plurality of display elements arranged in the display area, a thin film encapsulation layer that covers the display elements, the thin film encapsulation layer including an inorganic encapsulation layer and an organic encapsulation layer, a groove in the first non-display area, a planarization layer in the first non-display area, the planarization layer covering the groove, a first inorganic insulating layer under the planarization layer such that the first inorganic insulating layer is between the planarization layer and the substrate, and a second inorganic insulating layer over the planarization layer.

22 Claims, 26 Drawing Sheets

Related U.S. Application Data continuation of application No. 17/491,887, filed on Oct. 1, 2021, now Pat. No. 11,723,230, which is a continuation of application No. 16/441,846, filed on Jun. 14, 2019, now Pat. No. 11,139,451.

(51) Int. Cl.
| | |
|---|---|
| *G06F 3/042* | (2006.01) |
| *H10K 59/122* | (2023.01) |
| *H10K 59/131* | (2023.01) |
| *H10K 59/40* | (2023.01) |
| *H10K 59/80* | (2023.01) |

(52) U.S. Cl.
CPC ........... *H10K 59/122* (2023.02); *H10K 59/40* (2023.02); *H10K 59/8731* (2023.02); *H10K 59/131* (2023.02); *H10K 59/8722* (2023.02)

(56) References Cited

U.S. PATENT DOCUMENTS

| | | | | |
|---|---|---|---|---|
| 2001/0040645 | A1* | 11/2001 | Yamazaki | G02F 1/13454 |
| | | | | 349/42 |
| 2014/0183479 | A1* | 7/2014 | Park | H10K 59/1315 |
| | | | | 438/34 |
| 2016/0270209 | A1* | 9/2016 | Cho | H10K 59/805 |
| 2017/0031323 | A1 | 2/2017 | Kim et al. | |
| 2017/0148856 | A1 | 5/2017 | Choi et al. | |
| 2017/0162637 | A1* | 6/2017 | Choi | H01L 21/28 |
| 2017/0237037 | A1* | 8/2017 | Choi | H10K 50/844 |
| | | | | 257/40 |
| 2017/0278901 | A1* | 9/2017 | Kim | H10K 59/124 |
| 2017/0301877 | A1* | 10/2017 | Kim | H10K 50/8445 |
| 2017/0345883 | A1* | 11/2017 | Song | H10K 59/123 |
| 2017/0373129 | A1 | 12/2017 | Kim et al. | |
| 2018/0011385 | A1 | 1/2018 | Kang et al. | |
| 2018/0061899 | A1 | 3/2018 | Oh et al. | |
| 2018/0092225 | A1 | 3/2018 | Park et al. | |
| 2018/0151834 | A1* | 5/2018 | Kanaya | H10D 30/6746 |
| 2018/0183015 | A1* | 6/2018 | Yun | H10K 71/00 |
| 2018/0226617 | A1* | 8/2018 | Nakagawa | H10K 59/8731 |
| 2019/0197282 | A1* | 6/2019 | Gong | G06V 40/1329 |
| 2019/0326549 | A1* | 10/2019 | Kokame | G09F 9/30 |
| 2019/0348476 | A1* | 11/2019 | Kato | G06F 3/0443 |
| 2020/0052051 | A1* | 2/2020 | Lee | H10D 86/451 |
| 2020/0067017 | A1* | 2/2020 | Seo | H10K 77/10 |
| 2020/0106045 | A1* | 4/2020 | Han | H10K 59/122 |
| 2020/0106046 | A1* | 4/2020 | Kim | H10K 59/8731 |
| 2020/0119304 | A1* | 4/2020 | Choi | H10K 59/12 |
| 2020/0127231 | A1* | 4/2020 | Yun | H10K 59/124 |
| 2020/0144341 | A1* | 5/2020 | Choi | H10K 77/10 |
| 2020/0168851 | A1* | 5/2020 | Managaki | H05B 33/04 |
| 2021/0134935 | A1* | 5/2021 | Naganuma | H10K 59/121 |

FOREIGN PATENT DOCUMENTS

| | | |
|---|---|---|
| EP | 3 293 765 | 3/2018 |
| EP | 3588571 A1 | 1/2020 |
| EP | 3 618 120 | 3/2020 |
| KR | 10-2017-0059864 | 5/2017 |
| KR | 10-2017-0066767 | 6/2017 |
| KR | 10-2018-0005327 | 1/2018 |
| KR | 10-1834792 | 3/2018 |
| KR | 10-2018-0076429 | 7/2018 |
| KR | 10-2020-0044442 A | 4/2020 |

\* cited by examiner

410

CP1

CNT y x

FIG. 19

DISPLAY PANEL

CROSS-REFERENCE TO RELATED APPLICATIONS

This is a continuation application of U.S. patent application Ser. No. 18/352,470, filed on Jul. 14, 2023 (now pending), the disclosure of which is incorporated herein by reference in its entirety. U.S. patent application Ser. No. 18/352,470 is a continuation application of U.S. patent application Ser. No. 17/491,887, filed on Oct. 1, 2021, now U.S. Pat. No. 11,723,230, issued Aug. 8, 2023, the disclosure of which is incorporated herein by reference in its entirety. U.S. patent application Ser. No. 17/491,887 is a continuation application of U.S. patent application Ser. No. 16/441,846, filed on Jun. 14, 2019, now U.S. Pat. No. 11,139,451, issued Oct. 5, 2021, the disclosure of which is incorporated herein by reference in its entirety. U.S. patent application Ser. No. 16/441,846 claims priority benefit of Korean Patent Application No. 10-2018-0144678, filed on Nov. 21, 2018 in the Korean Intellectual Property Office, the disclosure of which is incorporated herein by reference in its entirety for all purposes.

BACKGROUND

1. Field

One or more embodiments relate to a display panel including an opening area and/or an opening and a display apparatus including the display panel.

2. Description of the Related Art

Display apparatuses have been used for various purposes. Also, since the thickness and weight of the display apparatuses have been reduced, a utilization range of the display apparatuses has increased.

SUMMARY

Embodiments are directed to a display panel including a substrate including an opening area, a display area, and a first non-display area, the first non-display area being between the opening area and the display area, a plurality of display elements arranged in the display area, a thin film encapsulation layer that covers the display elements, the thin film encapsulation layer including an inorganic encapsulation layer and an organic encapsulation layer, a groove in the first non-display area, a planarization layer in the first non-display area, the planarization layer covering the groove, a first inorganic insulating layer under the planarization layer such that the first inorganic insulating layer is between the planarization layer and the substrate, and a second inorganic insulating layer over the planarization layer.

The thin film encapsulation layer may be under the first inorganic insulating layer.

The first inorganic insulating layer may directly contact the inorganic encapsulation layer.

The first inorganic insulating layer may have a thickness that is less than a thickness of the inorganic encapsulation layer.

In a first region of the first non-display area, the second inorganic insulating layer may directly contact an upper surface of the first inorganic insulating layer, and the first inorganic insulating layer may directly contact an upper surface of the inorganic encapsulation layer.

The display panel may further include a barrier wall in the first non-display area. The first region may correspond to the barrier wall.

The first inorganic insulating layer and the second inorganic insulating layer may cover the first non-display area and the display area.

The substrate may further include a second non-display area surrounding the display area. At least one of the first inorganic insulating layer or the second inorganic insulating layer may further extend beyond an edge of the inorganic encapsulation layer in the second non-display area.

The second inorganic insulating layer may have a thickness greater than a thickness of the first inorganic insulating layer.

The substrate may include an opening corresponding to the opening area. Respective ends of the first inorganic insulating layer and the second inorganic insulating layer may be located on a vertical line that is the same as a vertical line on which an end of the substrate is located, the end of the substrate defining the opening.

The display panel may further include an upper insulating layer on the second inorganic insulating layer.

The display panel may further include an input sensing layer in the display area, the input sensing layer including conductive layers and insulating layers. At least one of the second inorganic insulating layer and the upper insulating layer may include a material that is the same as a material included in one of the insulating layers of the input sensing layer.

The planarization layer may have a loop shape surrounding the opening area in the first non-display area.

The planarization layer may include a material that is different from a material included in the organic encapsulation layer.

Embodiments are also directed to a display panel including a substrate that includes an opening area, a display area, and an intermediate area between the opening area and the display area, the substrate including an opening corresponding to the opening area, a plurality of display elements in the display area, a first barrier wall in the intermediate area, a thin film encapsulation layer that covers the display elements, the thin film encapsulation layer including an organic encapsulation layer on a side of the first barrier wall and an inorganic encapsulation layer, a planarization layer in the intermediate area, a first inorganic insulating layer under the planarization layer such that the first inorganic insulating layer is between the planarization layer and the substrate, and a second inorganic insulating layer over the planarization layer.

The first inorganic insulating layer may be on the inorganic encapsulation layer in direct contact with the inorganic encapsulation layer.

The display panel may further include a second barrier wall closer to the opening than the first barrier wall.

The display panel may further include an organic material layer between the opening and the second barrier wall and spaced apart from the organic encapsulation layer. The organic material layer may include a material that is the same as a material included in the organic encapsulation layer.

The planarization layer may be only in the intermediate area.

The planarization layer may include a hole extending along an edge of the opening and a first portion and a second portion spaced apart from each other based on the hole.

The second inorganic insulating layer and the first inorganic insulating layer may contact each other via the hole in the planarization layer.

Each of the first inorganic insulating layer and the second inorganic insulating layer may contact the planarization layer.

The thin film encapsulation layer may further include a lower inorganic encapsulation layer. The organic encapsulation layer may be between the lower inorganic encapsulation layer and the inorganic encapsulation layer.

The inorganic encapsulation layer and the lower inorganic encapsulation layer may contact each other in a region of the intermediate area, the region being between the opening and the first barrier wall.

The substrate may further include an external area surrounding the display area. At least one of the first inorganic insulating layer or the second inorganic insulating layer may further extend beyond an edge of the inorganic encapsulation layer in the external area.

BRIEF DESCRIPTION OF THE DRAWINGS

Features will become apparent to those of skill in the art by describing in detail exemplary embodiments with reference to the attached drawings in which:

FIGS. 19 and 20 illustrate cross-sectional views of a display panel according to another embodiment, respectively.

DETAILED DESCRIPTION

Figure 1:
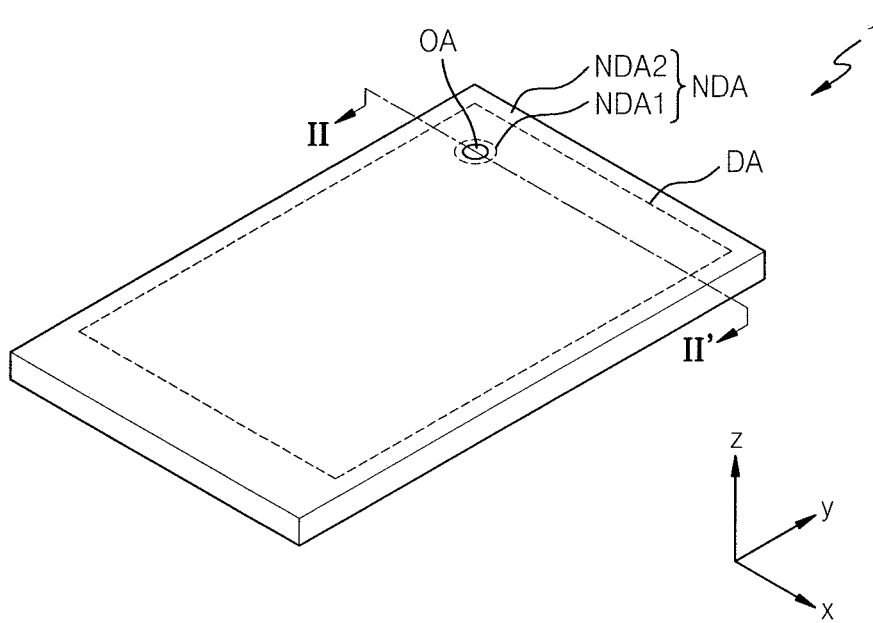
FIG. 1 illustrates a perspective view of a display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

While such terms as "first," "second," etc., may be used to describe various components, such components are not be limited to the above terms. The above terms are used only to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

FIG. 1 illustrates a perspective view of a display apparatus 1 according to an embodiment.

Referring to FIG. 1, the display apparatus 1 may include a display area DA that emits light and a non-display area NDA that does not emit light. The non-display area NDA may be adjacent to the display area DA. The display apparatus 1 may provide a predetermined image via light emitted from a plurality of pixels arranged in the display area DA.

The display apparatus 1 may include an opening area OA that is at least partially surrounded by the display area DA. As an embodiment, FIG. 1 shows that the opening area OA is entirely surrounded by the display area DA. An intermediate area in which pixels are not arranged may be provided between the opening area OA and the display area DA. The display area DA may be surrounded by an outer area (or peripheral area) in which pixels are not provided. The intermediate area and the outer area are respective non-display areas, in which pixels are not provided. Hereinafter, the intermediate area and the outer area are described respectively as a first non-display area NDA1 and a second non-display area NDA2. The first non-display area NDA1 may entirely surround the opening area OA, and the display area DA may entirely surround the first non-display area NDA1. The second non-display area NDA2 may entirely surround the display area DA. The first non-display area NDA1 and the second non-display area NDA2 may be collectively referred to as a non-display area NDA.

Hereinafter, according to an embodiment, the display apparatus is described as an organic light-emitting display apparatus. In some implementations, the display apparatus 1 may be an inorganic light-emitting display, a quantum dot light-emitting display, etc.

FIG. 1 shows that one opening area OA is provided, and that the opening area OA has a circular shape. In some implementations, two or more opening areas OA may be provided, and each opening area OA may have various shapes such as a circular shape, an elliptic shape, a polygonal shape, a star shape, a diamond shape, etc.

Figure 2:
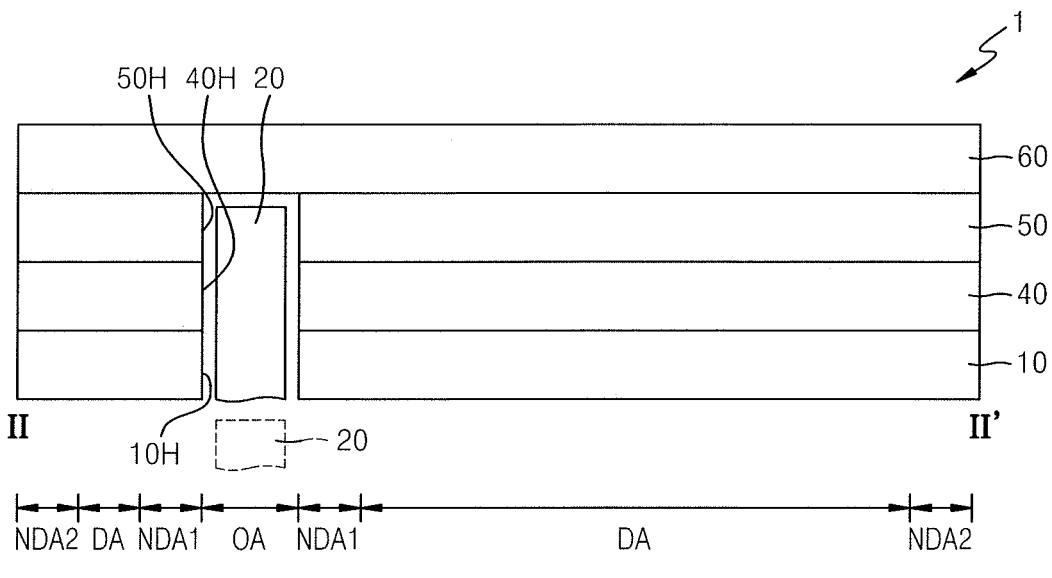
FIG. 2 illustrates a cross-sectional view of a display apparatus according to an embodiment.
Figure 2:
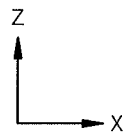

FIG. 2 illustrates a cross-sectional view of the display apparatus 1 according to the embodiment, taken along a line II-II' of FIG. 1.

Referring to FIG. 2, the display apparatus 1 may include a display panel 10, an input sensing layer 40 on the display panel 10, and an optical functional layer 50, which may be covered by a window 60. The display apparatus 1 may be, for example, one of various electronic devices such as a mobile phone, a laptop computer, a smart watch, etc.

The display panel 10 may display images. The display panel 10 may include pixels arranged in the display area DA. Each of the pixels may include a display element and a pixel circuit connected to the display element. The display element may include an organic light-emitting diode, an inorganic light-emitting diode, a quantum-dot light-emitting diode, etc.

The input sensing layer 40 may obtain coordinate information generated according to an external input, e.g., a touch event. The input sensing layer 40 may include a sensing electrode (or touch electrode) and trace lines connected to the sensing electrode. The input sensing layer 40 may be arranged on the display panel 10. The input sensing layer 40 may sense an external input by a mutual capacitance method and/or a self-capacitance method.

The input sensing layer 40 may be directly arranged on the display panel 10 or may be separately formed and then bonded to the display panel 10 via an adhesive layer such as an optical clear adhesive (OCA). For example, the input sensing layer 40 may be arranged successively after a process of forming the display panel 10. In this case, the adhesive layer may be omitted between the input sensing layer 40 and the display panel 10. FIG. 2 shows an embodiment in which the input sensing layer 40 is arranged between the display panel 10 and the optical functional layer 50. In some implementations, the input sensing layer 40 may be arranged on the optical functional layer 50.

The optical functional layer 50 may include an anti-reflection layer. The anti-reflection layer may reduce a reflectivity of light incident to the display panel 10 from outside (external light) via the window 60. The anti-reflection layer may include a retarder and a polarizer. The retarder may be of a film type or a liquid crystal coating type.

The retarder may include a λ/2 retarder and/or a λ/4 retarder. The polarizer may be of a film type or a liquid crystal coating type. The film type polarizer may include a stretched synthetic resin film. The liquid crystal coating type polarizer may include liquid crystals arranged in a predetermined orientation. The retarder and the polarizer may further include a protective film. The retarder and the polarizer themselves or the protective film may be defined as a base layer of the anti-reflection layer.

As another embodiment, the anti-reflection layer may include a black matrix and color filters. The color filters may be arranged considering a color of light emitted from each of the pixels in the display panel 10. As another embodiment, the anti-reflection layer may include a destructive interference structure. The destructive interference structure may include a first reflective layer and a second reflective layer arranged on different layers. First reflected light and second reflected light that are respectively reflected by the first reflective layer and the second reflective layer may be destructively interfered with each other, and accordingly a reflectivity of external light may be reduced.

The optical functional layer 50 may include a lens layer. The lens layer may improve the light-emitting efficiency of light emitted from the display panel 10 or may reduce color difference. The lens layer may include a layer having a concave or a convex lens shape and/or may include a plurality of layers having different refractive indices. The optical functional layer 50 may include both the anti-reflection layer and the lens layer or may include either the anti-reflection layer or the lens layer.

The display panel 10, the input sensing layer 40, and the optical functional layer 50 may each include an opening. Regarding this, FIG. 2 shows that the display panel 10, the input sensing layer 40, and the optical functional layer 50 respectively include first to third openings 10H, 40H, and 50H that overlap with one another. The first opening 10H passes from a top surface to a bottom surface of the display panel 10. The second opening 40H passes from a top surface to a bottom surface of the input sensing layer 40. The third opening 50H passes from a top surface to a bottom surface of optical functional layer 50. The first to third openings 10H, 40H, and 50H may be located to correspond to the opening area OA. As another embodiment, at least one of the display panel 10, the input sensing layer 40, or the optical functional layer 50 may not include an opening. For example, the opening may be omitted from one or two elements selected from the display panel 10, the input sensing layer 40, and the optical functional layer 50. The term "opening area OA" may indicate an area in which at least one of the first to third openings 10H, 40H, or 50H of the display panel 10, the input sensing layer 40, or the optical functional layer 50 is located. For example, in the specification, the opening area OA may be an area in which the first opening 10H of the display panel 10 is located.

The opening area OA may be a kind of component area (e.g., a sensor region, a camera region, a speaker region, etc.) in which a component 20 for adding various functions to the display apparatus 1 is located. The component 20 may be located in the first to third openings 10H, 40H, and 50H as indicated by a solid line in FIG. 2. In some implementations, the component 20 may be arranged under the display panel 10 as indicated by a dashed line. In this case, the opening may be omitted from one or more of the display panel 10, the input sensing layer 40, and the optical functional layer 50. As an embodiment, when the display panel 10 does not include an opening, at least one of elements of the display panel 10, wherein the elements are located in the opening area OA and will be described later with reference to FIG. 12, etc., includes a hole or an opening corresponding to the opening area OA and the other elements may be present. As an embodiment, when the display panel 10 does not include an opening, a component 20 that does not have to have a relatively high transmittance, e.g., an infrared ray (IR) sensor, etc., may be arranged in the opening area OA.

The component 20 may include an electronic element. For example, the component 20 may be an electronic element that uses light or sound. For example, the electronic element may include a sensor using light, such as an IR sensor, a camera capturing an image by receiving light, a sensor for outputting and sensing light or sound to measure a distance or recognize a fingerprint, a small-sized lamp illuminating light, a speaker for outputting sound, etc. The electronic element using light may use light of various wavelength bands such as visible light, IR light, ultraviolet (UV) rays, etc. In some embodiments, the opening area OA may be considered as a transmission area through which light and/or sound output from the component 20 or proceeding towards the electronic element may pass from the outside.

In an embodiment, when the display apparatus 1 is used in a smart watch or an instrument panel for a vehicle, the component 20 may include a member having a clock needle or a needle indicating predetermined information (e.g., vehicle velocity, etc.). When the display apparatus 1 includes a clock needle or an instrument panel for a vehicle, the component 20 may be exposed to outside after penetrating through the window 60, and the window 60 may include an opening corresponding to the opening area OA.

The component 20 may include element(s) related to functions of the display panel 10 as described above or may include element(s) such as an accessory that increases an aesthetic sense of the display panel 10. For example, a layer including an OCA, etc. may be located between the window 60 and the optical functional layer 50.

Figure 3:
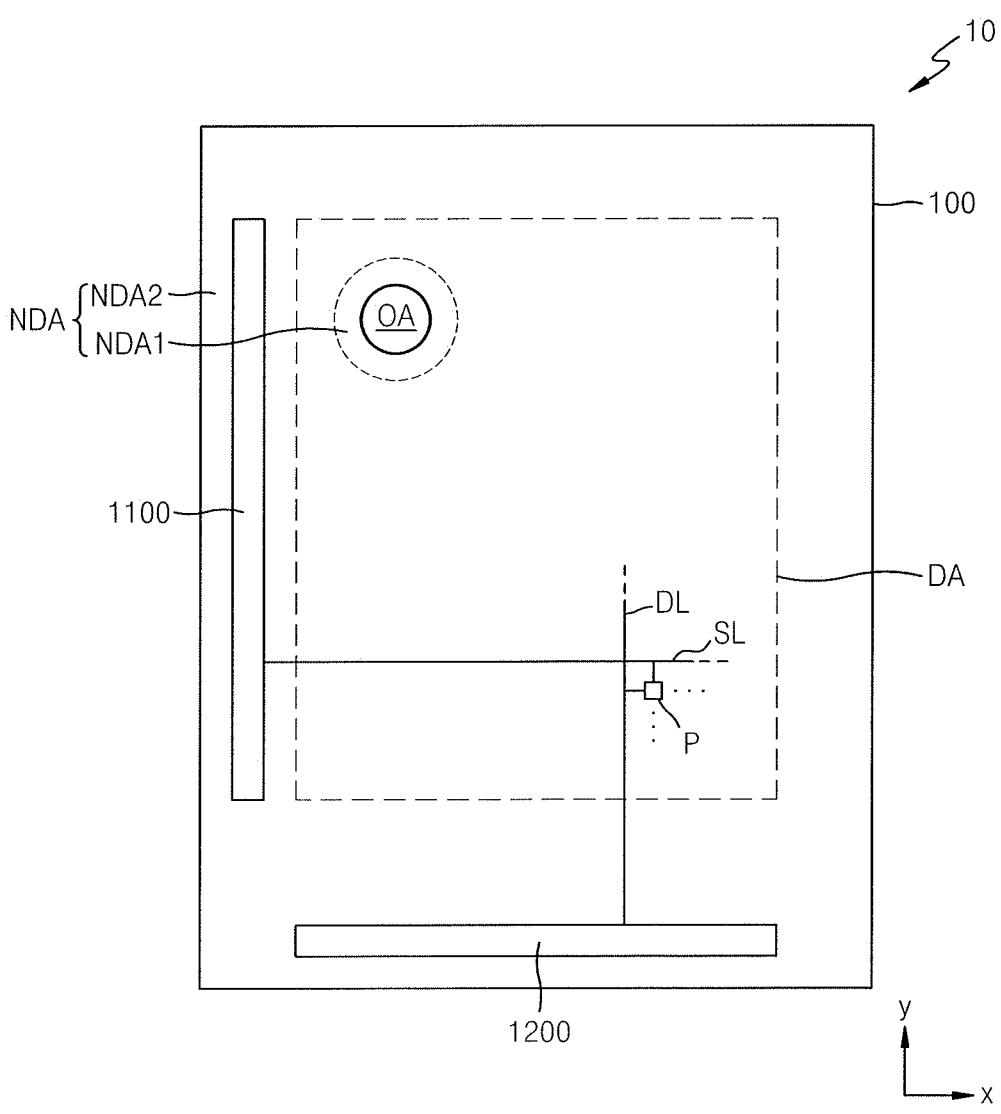
FIG. 3 illustrates a plan view of a display panel according to an embodiment.
Figure 4:
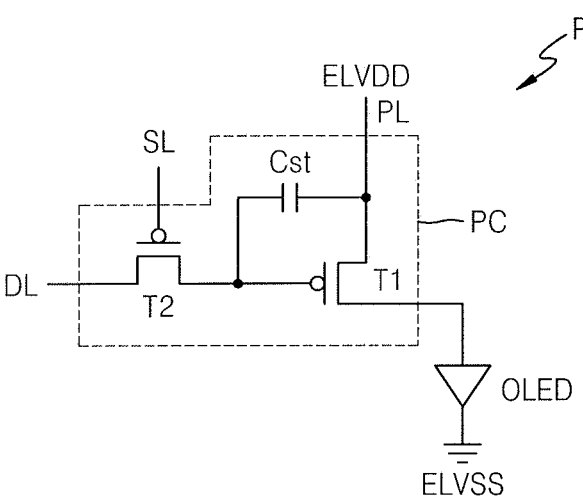
FIG. 4 illustrates an equivalent circuit diagram of a pixel in a display panel according to an embodiment.

FIG. 3 illustrates a plan view of the display panel 10 according to the embodiment. FIG. 4 is an equivalent circuit diagram of a pixel in the display panel 10.

Referring to FIG. 3, the display panel 10 may include the opening area OA, the display area DA and the first and second non-display areas NDA1 and NDA2. FIG. 3 includes a substrate 100 in the display panel 10. For example, it may be appreciated that the substrate 100 includes the opening area OA, the display area DA, and the first and second non-display areas NDA1 and NDA2.

The display panel 10 includes a plurality of pixels P arranged in the display area DA. Each of the pixels P includes a pixel circuit PC and a display element connected to the pixel circuit PC, e.g., an organic light-emitting diode OLED. The pixel circuit PC may include a first thin film transistor T1, a second thin film transistor T2, and a storage capacitor Cst. Each pixel P may emit, for example, red light, green light, or blue light via the organic light-emitting diode OLED, or may emit red light, green light, blue light, or white light via the organic light-emitting diode OLED.

The second thin film transistor T2 is a switching thin film transistor and is connected to a scan line SL and a data line DL. The second thin film transistor T2 may transfer a data voltage input from the data line DL to the first thin film transistor T1 according to a switching voltage input from the scan line SL. The storage capacitor Cst may be connected to the second thin film transistor T2 and a driving voltage line PL and may store a voltage corresponding to a difference between a voltage transferred from the second thin film transistor T2 and a first power voltage ELVDD supplied to the driving voltage line PL.

The first thin film transistor T1 is a driving thin film transistor connected to the driving voltage line PL and the storage capacitor Cst. The first thin film transistor T1 may control a driving current flowing in the organic light-emitting diode OLED from the driving voltage line PL, corresponding to the voltage value stored in the storage capacitor Cst. The organic light-emitting diode OLED may emit light having a predetermined luminance according to the driving current. An opposite electrode (e.g., a cathode) of the organic light-emitting diode OLED may be supplied with a second power voltage ELVSS.

FIG. 4 illustrates that the pixel circuit PC includes two thin film transistors and one storage capacitor, as an example. The number of thin film transistors and the number of storage capacitors may vary depending on a design of the pixel circuit PC.

Referring back to FIG. 3, the first non-display area NDA1 may surround the opening area OA. The first non-display area NDA1 is an area in which a display element such as an organic light-emitting diode that emits light is not present. Trace lines for providing signals to the pixels P around the opening area OA may pass through the first non-display area NDA1. The second non-display area NDA2 may include a scan driver 1100 for providing each pixel P with a scan signal, a data driver 1200 for providing each pixel P with a data signal, and a main power line for supplying first and second power voltages. FIG. 3 shows that the data driver 1200 is arranged adjacent to a side of the substrate 100, as an example. In some implementations, the data driver 1200 may be arranged on a flexible printed circuit board (FPCB) that is electrically connected to a pad arranged at a side of the display panel 10.

Figure 5:
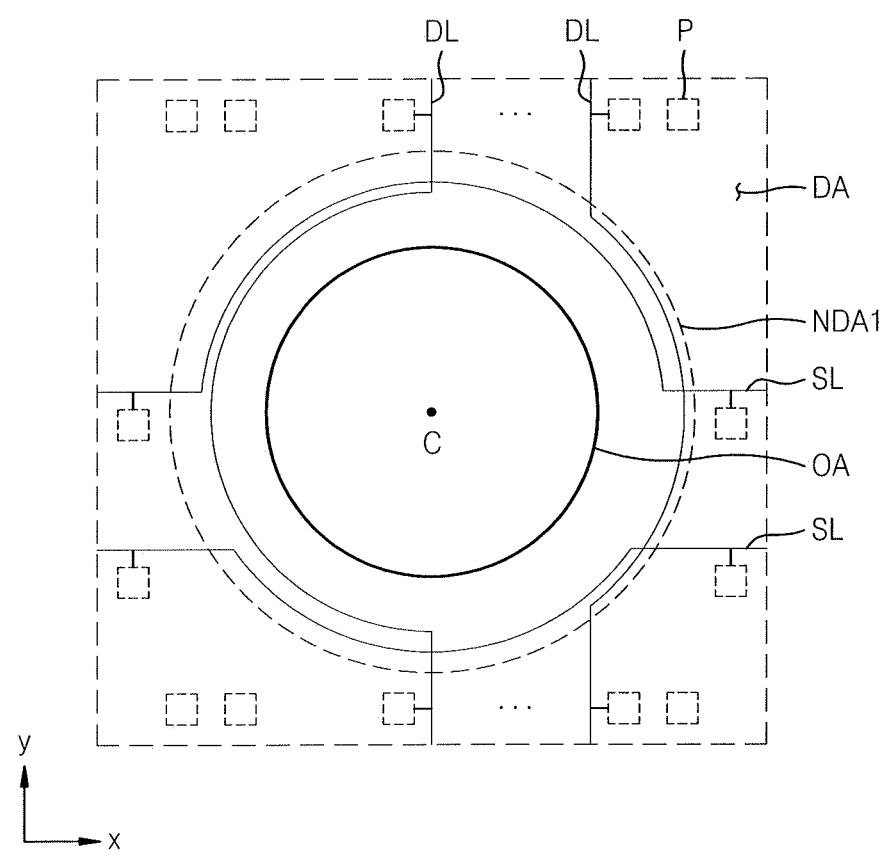
FIG. 5 illustrates a plan view partially showing a display panel according to an embodiment.

FIG. 5 illustrates a plan view showing a portion of the display panel 10 and the signal lines located in the first non-display area NDA1, according to the embodiment.

Referring to FIG. 5, the pixels P may be arranged in the display area DA around the opening area OA, and the first non-display area NDA1 may be located between the opening area OA and the display area DA.

The pixels P may be apart from one another on the plane around the opening area OA. For example, two pixels P may be spaced apart from each other with the opening area OA therebetween. As shown in FIG. 5 the pixels P may be arranged above and under the opening area OA (for example, space apart in the y direction) or may be arranged on left and right sides of the opening area OA (for example, spaced apart in the x direction).

Among the signal lines supplying signals to the pixels P, the signal lines adjacent to the opening area OA may detour (or bypass) around the opening area OA. Some of the data lines DL passing through the display area DA may extend in a y-axis direction to provide data signals to the pixels P arranged above and under the opening area OA. These data lines DL may detour along an edge of the opening area OA in the first non-display area NDA1. Some of the scan lines SL passing through the display area DA may extend in an x-axis direction to provide scan signals to the pixels P arranged on left and right sides of the opening area OA. These scan lines SL may detour along an edge of the opening area OA in the first non-display area NDA1.

Figure 6:
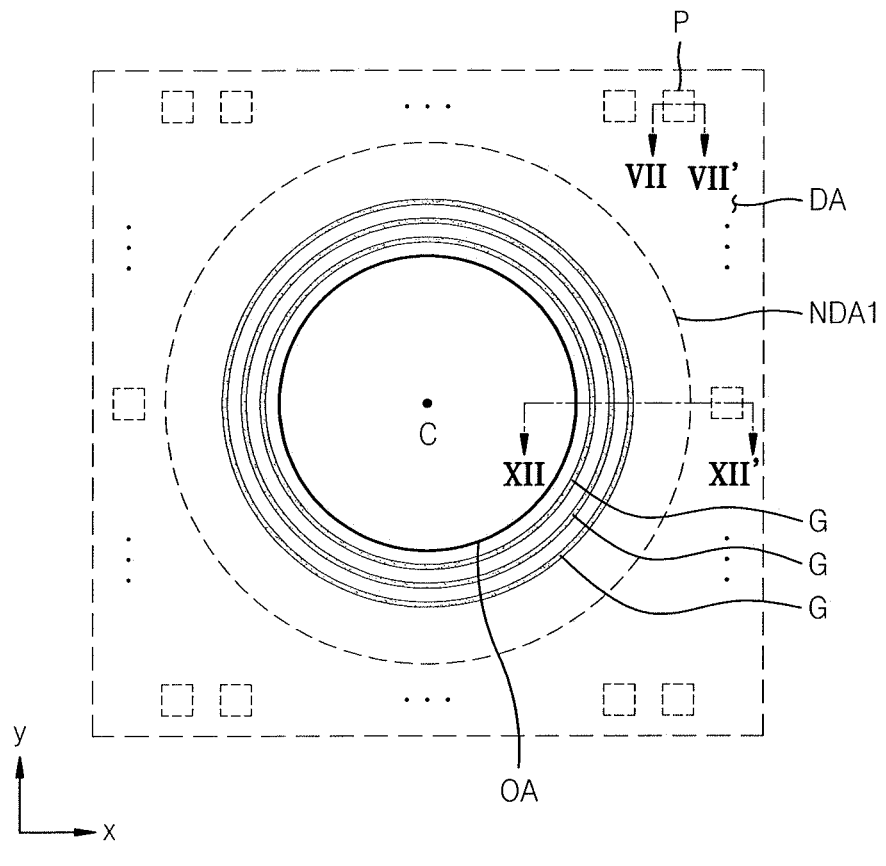
FIG. 6 illustrates a plan view partially showing a display panel according to an embodiment.

FIG. 6 illustrates a plan view showing a portion of the display panel 10 and grooves located in the first non-display area NDA1, according to an embodiment.

Referring to FIG. 6, one or more grooves may be located in the first non-display area NDA1 between the opening area OA and the display area DA. As an example, FIG. 6 shows three grooves G located between the opening area OA and the display area DA.

The grooves G may be formed in loop (or ring) shapes entirely surrounding the opening area OA in the plane in the first non-display area NDA1. A radius of each groove G from a center C of the opening area OA on the plane may be greater than that of the opening area OA. The grooves G may be spaced apart from one another.

Referring to FIGS. 5 and 6, the grooves G may be closer to the opening area OA than the arched portions of the data line DL and/or the scan line SL that detour around the edge of the opening area OA.

Figure 7:
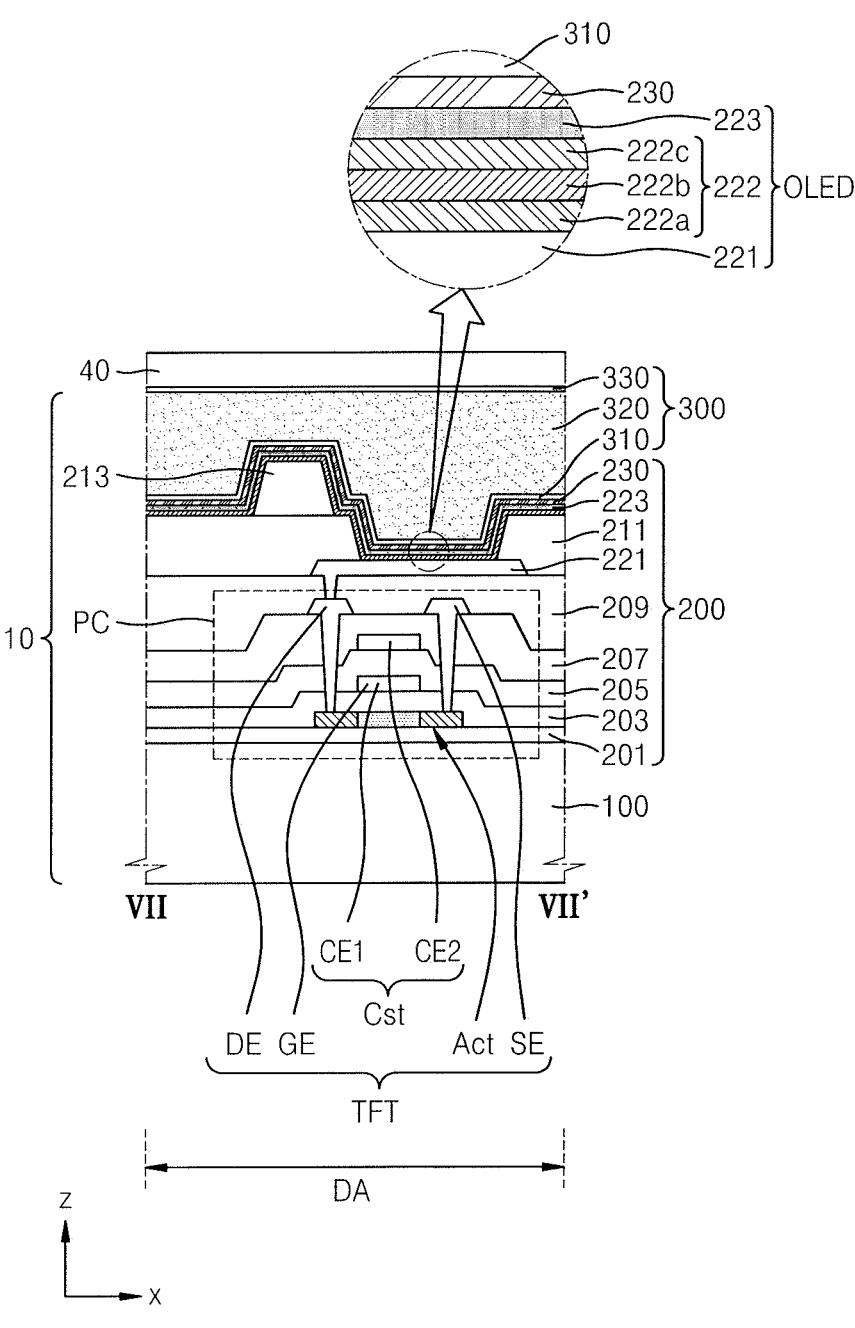
FIG. 7 illustrates a cross-sectional view of a display panel according to an embodiment.

FIG. 7 illustrates a cross-sectional view taken along a line VII-VII' of FIG. 6 of the display panel 10 according to the embodiment.

Referring to FIG. 7, the pixel circuit PC and the organic light-emitting diode OLED electrically connected to the pixel circuit PC may be arranged in the display area DA. The pixel circuit PC is arranged on the substrate 100 and the organic light-emitting diode OLED may be located on the pixel circuit PC. The pixel circuit PC may include a thin film transistor TFT and a storage capacitor Cst on the substrate 100. A pixel electrode 221 may be electrically connected to the thin film transistor TFT and the storage capacitor Cst.

The substrate 100 may include a polymer resin or a glass material. In one embodiment, the substrate 100 may include a polymer resin such as a polyether sulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), cellulose acetate propionate (CAP), etc. In this case, the substrate 100 may be flexible. The substrate 100 may include a glass material mainly containing $SiO_2$ or a resin such as reinforced plastic. In this case, the substrate 100 may be rigid. The substrate 100 may have a stack structure including a layer including polymer resin and a barrier layer on the polymer resin layer to improve the flexibility of the substrate 100. The barrier layer may include silicon nitride ($SiN_x$, x>0), silicon oxynitride (SiON), silicon oxide ($SiO_x$, x>0), etc.

A buffer layer 201 may be on the substrate 100 in order to help prevent impurities from infiltrating into a semiconductor layer Act of the thin film transistor TFT. The buffer layer 201 may include an inorganic insulating material such as $SiN_x$, SiON, and $SiO_x$ and may have a single-layered or multi-layered structure including the inorganic insulating material.

The pixel circuit PC may be arranged on the buffer layer 201. The pixel circuit PC may include the thin film transistor TFT and the storage capacitor Cst. The thin film transistor TFT may include a semiconductor layer Act, a gate electrode GE, a source electrode SE, and a drain electrode DE. The thin film transistor TFT shown in FIG. 7 may correspond to the driving thin film transistor described above with reference to FIG. 4. FIG. 7 shows the thin film transistor TFT as being a top gate-type transistor in which the gate electrode GE is over the semiconductor layer Act with a gate insulating layer 203 provided therebetween is shown. In some implementations, the thin film transistor TFT may be a bottom gate-type transistor.

The semiconductor layer Act may include polysilicon. In some implementations, the semiconductor layer Act may include amorphous silicon, oxide semiconductor, organic semiconductor, etc. The gate electrode GE may include a low-resistive metal material. The gate electrode GE may include a conductive material including molybdenum (Mo), aluminum (Al), copper (Cu), titanium (Ti), etc. The gate electrode GE may have a single-layered structure or a multi-layered structure.

The gate insulating layer 203 may be between the semiconductor layer Act and the gate electrode GE and may include inorganic insulating material such as silicon oxide, silicon nitride, silicon oxynitride, aluminum oxide, titanium oxide, tantalum oxide, hafnium oxide, etc. The gate insulating layer 203 may have a single-layered structure or a multi-layered structure including the above materials.

The source electrode SE and the drain electrode DE may include a highly conductive material. The source electrode SE and the drain electrode DE may include a conductive material including Mo, Al, Cu, Ti, etc. The source electrode SE and the drain electrode DE may have a single-layered structure or a multi-layered structure including the above materials. As an embodiment, the source electrode SE and the drain electrode DE may have a multi-layered structure including Ti/Al/Ti.

The storage capacitor Cst may include a lower electrode CE1 and an upper electrode CE2 overlapping each other in the z direction with a first interlayer insulating layer 205 provided therebetween. The storage capacitor Cst may overlap the thin film transistor TFT. Regarding this, FIG. 7 shows a structure in which the gate electrode GE of the thin film transistor TFT is the lower electrode CE1 of the storage capacitor Cst. In some implementations, the storage capacitor Cst may not overlap the thin film transistor TFT. The storage capacitor Cst may be covered by a second interlayer insulating layer 207.

The first and second interlayer insulating layers 205 and 207 may each include inorganic insulating material such as silicon oxide, silicon nitride, silicon oxynitride, aluminum oxide, titanium oxide, tantalum oxide, hafnium oxide, etc. The first and second interlayer insulating layers 205 and 207 may have a single-layered structure or a multi-layered structure including the above materials.

The pixel circuit PC including the thin film transistor TFT and the storage capacitor Cst may be covered by a planarized insulating layer 209. The planarized insulating layer 209 may have a flat upper surface. The planarized insulating layer 209 may include a general-purpose polymer (e.g., polymethylmethacrylate (PMMA) or polystyrene (PS)), a polymer derivative having phenol groups, an acryl-based polymer, an imide-based polymer, an aryl ether-based polymer, an amide-based polymer, a fluoride-based polymer, a p-xylene-based polymer, a vinyl alcohol-based polymer, or blends thereof. For example, the planarized insulating layer 209 may include polyimide. In some implementations, the planarized insulating layer 209 may include an inorganic insulating material, or inorganic and organic insulating materials.

The pixel electrode 221 may be formed on the planarized insulating layer 209. The pixel electrode 221 may include a conductive oxide such as indium tin oxide (ITO), indium zinc oxide (IZO), zinc oxide (ZnO), indium oxide ($In_2O_3$), indium gallium oxide, or aluminum zinc oxide (AZO). In some implementations, the pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. In some implementations, the pixel electrode 221 may further include a layer including ITO, IZO, ZnO, or $In_2O_3$ on and/or under the reflective layer.

A pixel defining layer 211 may be formed on the pixel electrode 221. The pixel defining layer 211 may include an opening exposing an upper surface of the pixel electrode 221 while covering edges of the pixel electrode 221. The pixel defining layer 211 may include an organic insulating material. In some implementations, the pixel defining layer 211 may include an inorganic insulating material such as $SiN_x$, SiON, or $SiO_x$. In some implementations, the pixel defining layer 211 may include an organic insulating material and an inorganic insulating material.

An intermediate layer 222 may include an emission layer 222b. The intermediate layer 222 may include a first functional layer 222a under the emission layer 222b and/or a second functional layer 222c on the emission layer 222b. The emission layer 222b may include a polymer or low-molecular weight organic material to emit a predetermined color light.

The first functional layer 222a may have a single-layered structure or a multi-layered structure. For example, when the first functional layer 222a includes a polymer material, the first functional layer 222a may include a hole transport layer (HTL) having a single-layered structure. The hole transport layer HTL may include poly-(3,4)-ethylene-dihydroxy thiophene (PEDOT) or polyaniline (PANI). When the first functional layer 222a includes a low-molecular weight material, the first functional layer 222a may include a hole injection layer (HIL) and an HTL.

The second functional layer 222c is optional. For example, when the first functional layer 222a and the emission layer 222b include a polymer material, the second functional layer 222c may be formed. The second functional layer 222c may have a single-layered structure or a multi-layered structure. The second functional layer 222c may include an electron transport layer (ETL) and/or an electron injection layer (EIL).

The emission layer 222b of the intermediate layer 222 may be arranged in all pixels of the display area DA. The emission layer 222b may contact an upper surface of the pixel electrode 221 that is exposed through the opening in the pixel defining layer 211. Unlike the emission layer 222b, the first and second functional layers 222a and 222c of the intermediate layer 222 may be arranged in the first non-display area NDA1 (see FIG. 12, etc.), as well as the display area DA of FIG. 7.

The opposite electrode 223 may include a conductive material having a low work function. For example, the opposite electrode 223 may include a (semi-)transparent layer including Ag, Mg, Al, Pt, Pd, Au, Ni, Nd, Ir, Cr, lithium (Li), calcium (Ca), or an alloy thereof. In some implementations, the opposite electrode 223 may further include a layer including ITO, IZO, ZnO, or $In_2O_3$ on the (semi-)transparent layer including the above material. The opposite electrode 223 may be formed in the first non-display area NDA1, as well as in the display area DA. The intermediate layer 222 and the opposite electrode 223 may be formed by a thermal evaporation method.

A capping layer 230 may be located on the opposite electrode 223. For example, the capping layer 230 may include LiF and may be formed by a thermal evaporation method. In some implementations, the capping layer 230 may include an inorganic insulating material such as $SiO_x$, $SiN_x$, and SiON. In some implementations, the capping layer 230 may be omitted.

A spacer 213 may be formed on the pixel defining layer 211. In some implementations, the spacer 213 may include an organic insulating material such as polyimide. In some implementations, the spacer 213 may include an inorganic insulating material such as $SiN_x$ and $SiO_x$. In some implementations, the spacer 213 may include an organic insulating material and an inorganic insulating material.

In some implementations, the spacer 213 may include a material that is different from that included in the pixel defining layer 211. In some implementations, the spacer 213 may include a material that is the same as that included in the pixel defining layer 211. In this case, the pixel defining layer 211 and the spacer 213 may be manufactured together through a mask process using a half-tone mask, etc. As an embodiment, the pixel defining layer 211 and the spacer 213 may include polyimide.

The organic light-emitting diode OLED may be covered by a thin film encapsulation layer 300. The thin film encapsulation layer 300 may include at least one organic encapsulation layer and at least one inorganic encapsulation layer. A stacking order and the number of organic and inorganic encapsulation layers may vary. For example, as shown in FIG. 7 the thin film encapsulation layer 300 may include first and second inorganic encapsulation layers 310 and 330 and an organic encapsulation layer 320 disposed between the first and second inorganic encapsulation layers 310 and 330.

The first and second inorganic encapsulation layers 310 and 330 may include one or more inorganic insulating materials such as aluminum oxide, titanium oxide, tantalum oxide, hafnium oxide, zinc oxide, silicon oxide, silicon nitride, and silicon oxynitride. The first and second inorganic encapsulation layers 310 and 330 may be manufactured by chemical vapor deposition (CVD). The organic encapsulation layer 320 may include a polymer-based material. The polymer-based material may include a silicon-based resin, an acryl-based resin, an epoxy-based resin, polyimide, polyethylene, etc.

The input sensing layer 40 may be arranged on the display panel 10. As an example, the input sensing layer 40 may be directly formed on the display panel 10 and may contact the thin film encapsulation layer 300, as shown in FIG. 7.

Figure 8:
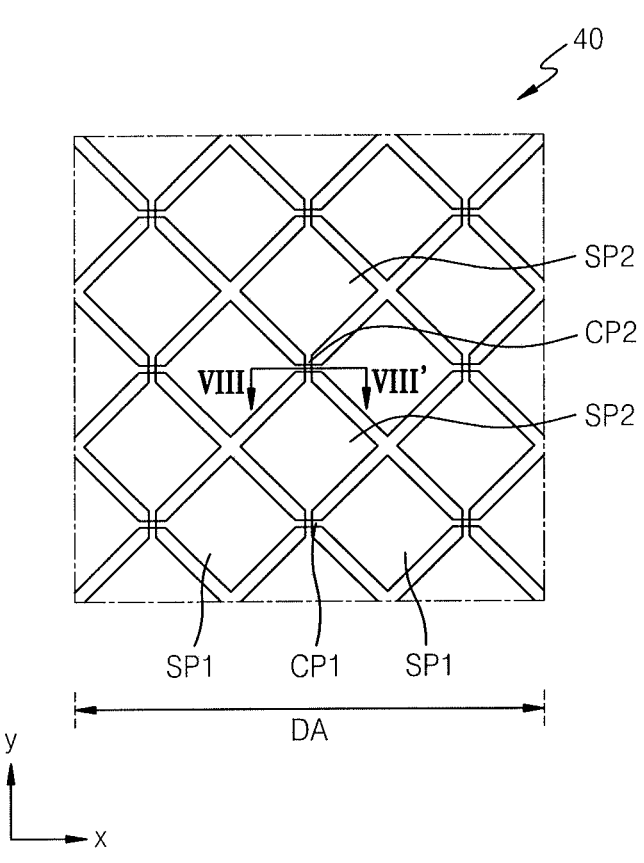
FIG. 8 illustrates a plan view showing an excerpt of an input sensing layer according to an embodiment.

FIG. 8 illustrates a plan view showing an excerpt of the input sensing layer 40 according to an embodiment. FIG. 8 illustrates a portion of the input sensing layer 40 that corresponds to the display area DA shown in FIG. 7.

Referring to FIG. 8, the input sensing layer 40 may include first sensing electrodes SP1 and second sensing electrodes SP2 located in the display area DA. The first sensing electrodes SP1 may be arranged in an x-axis direction and the second sensing electrodes SP2 are arranged in a y-axis direction intersecting with the first sensing electrodes SP1. The first sensing electrodes SP1 and the second sensing electrodes SP2 may intersect each other perpendicularly.

The first sensing electrodes SP1 and the second sensing electrodes SP2 may be arranged so that corners thereof are adjacent to each other. The first sensing electrodes SP1 may be electrically connected to one another via first connecting electrodes CP1, and the second sensing electrodes SP2 may be electrically connected to one another via second connecting electrodes CP2.

Figure 9A:
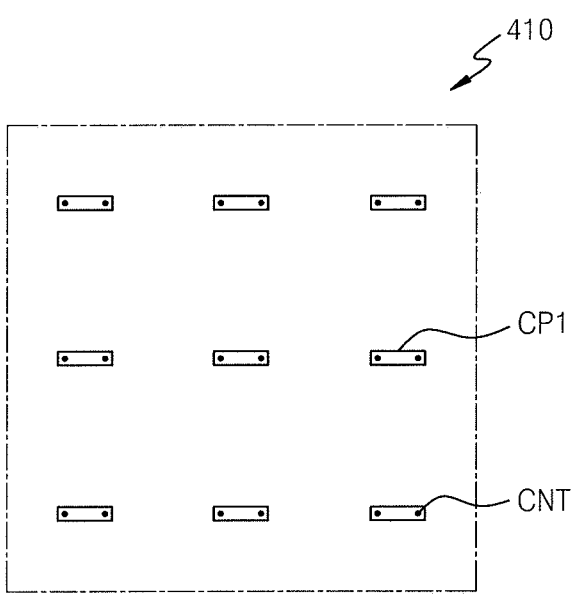
FIGS. 9A and 9B illustrate plan views of a first conductive layer and a second conductive layer in an input sensing layer according to an embodiment.
Figure 9A:
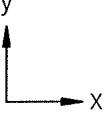
Figure 9B:
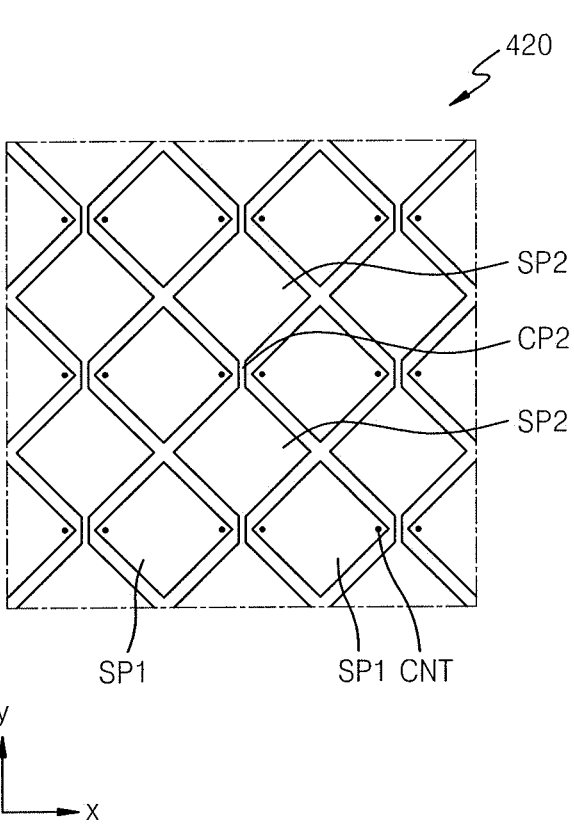
Figure 9C:
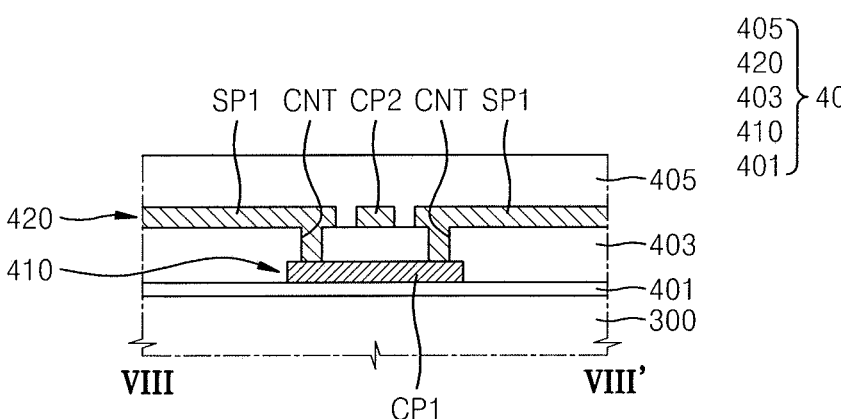
FIG. 9C is a cross-sectional view of an input sensing layer according to an embodiment.

FIGS. 9A and 9B illustrate plan views of a first conductive layer 410 and a second conductive layer 420 in an input sensing layer 40 according to an embodiment. FIG. 9C illustrates a cross-sectional view of an input sensing layer according to an embodiment, taken along a line VIII-VIII' of FIG. 8.

Referring to FIGS. 9A and 9B, the first sensing electrodes SP1 and the second sensing electrodes SP2 may be arranged on the same layer. The first conductive layer 410 may include the first connecting electrodes CP1 (see FIG. 9A), and the second conductive layer 420 may include the first sensing electrodes SP1, the second sensing electrodes SP2, and the second connecting electrodes CP2 (see FIG. 9B).

The second sensing electrodes SP2 may be connected to one another via the second connecting electrodes CP2 arranged at the same layer as the second sensing electrodes SP2. The first sensing electrodes SP1 are arranged in the x-axis direction and may be connected to one another via the first connecting electrodes CP1, which are arranged in a different layer from that of the first sensing electrodes SP1.

Referring to FIG. 9C, a second insulating layer 403 may be arranged between the first conductive layer 410 and the second conductive layer 420. The first sensing electrodes SP1 arranged in the second conductive layer 420 may be connected to the first connecting electrodes CP1 arranged in the first conductive layer 410 via contact holes CNT in the second insulating layer 403. The second conductive layer 420 may be covered by a third insulating layer 405, and a first insulating layer 401 may be arranged under the first conductive layer 410. The first and second insulating layers 401 and 403 may include an inorganic insulating layer such as SiN$_x$ or an organic insulating layer. The third insulating layer 405 may include an organic insulating layer or an inorganic insulating layer. The first and second conductive layers 410 and 420 may each include a metal layer or a transparent conductive layer. The metal layer may include Mo, Mb, Ag, Ti, Cu, Al, or an alloy thereof, and may have a single-layered or multi-layered structure. The transparent conductive layer may include a transparent conductive oxide material such as ITO, IZO, ZnO, ITZO, etc. In addition, the transparent conductive layer may include a conductive polymer such as PEDOT, metal nano-wires, graphene, etc.

FIG. 9C shows that the first insulating layer 401 is arranged between the thin film encapsulation layer 300 and the first conductive layer 410. In some implementations, the first insulating layer 401 may be omitted and the first conductive layer 410 may be located directly on the thin film encapsulation layer 300.

Figure 10A:
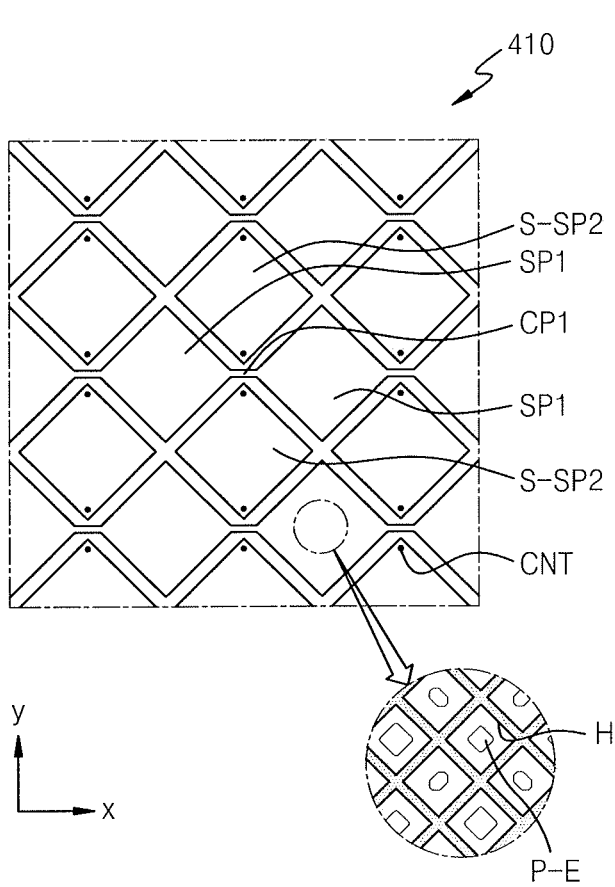
FIGS. 10A and 10B illustrate plan views of a first conductive layer and a second conductive layer in an input sensing layer according to another embodiment.
Figure 10B:
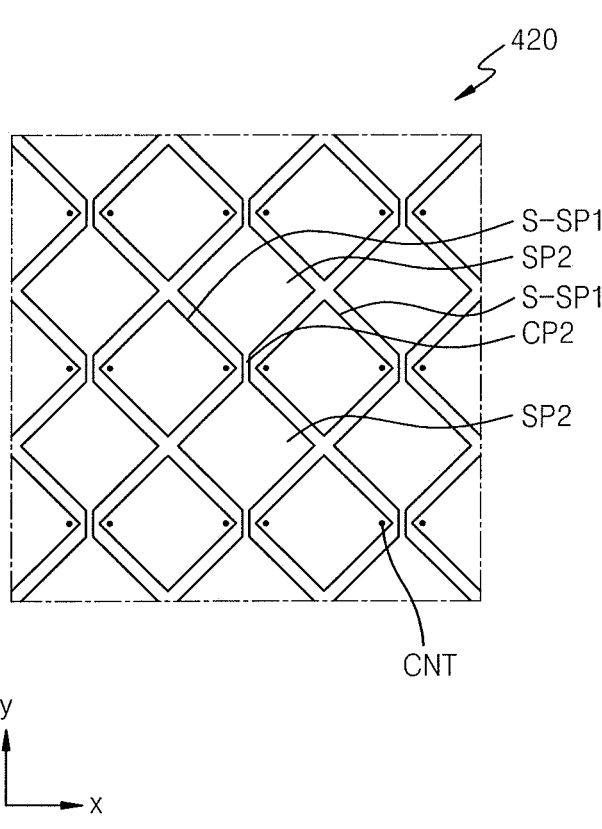
Figure 10C:
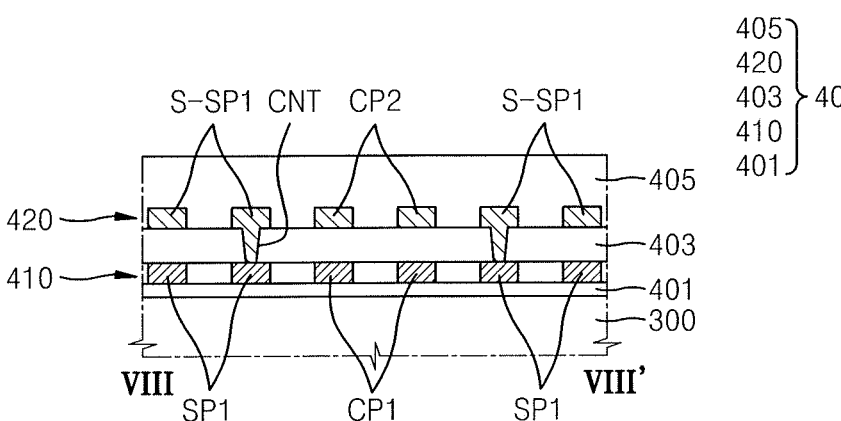
FIG. 10C is a cross-sectional view of an input sensing layer according to another embodiment.

FIGS. 10A and 10B illustrate plan views of a first conductive layer 410 and a second conductive layer 420 in an input sensing layer according to another embodiment, and FIG. 10C illustrate a cross-sectional view of the input sensing layer according to another embodiment, taken along a line VIII-VIII' of FIG. 8.

Referring to FIGS. 10A and 10B, the first conductive layer 410 includes the first sensing electrodes SP1 and the first connecting electrodes CP1 for connecting the first sensing electrodes SP1. The second conductive layer 420 includes the second sensing electrodes SP2 and the second connecting electrodes CP2 for connecting the second sensing electrodes SP2. The first conductive layer 410 may further include second auxiliary sensing electrodes S-SP2 that are connected to the second sensing electrodes SP2, and the second conductive layer 420 may further include first auxiliary sensing electrodes S-SP1 that are connected to the first sensing electrodes SP1. In some implementations, the first auxiliary sensing electrodes S-SP1 and the second auxiliary sensing electrodes S-SP2 may be omitted.

Referring to the enlarged view of FIG. 10A, each of the first sensing electrodes SP1 may have a mesh structure including a plurality of holes H. Each of the holes H may overlap a light-emission area P-E of the pixel P. Although not shown in the drawings, the second sensing electrodes SP2, the first auxiliary sensing electrodes S-SP1, and the second auxiliary sensing electrodes S-SP2 may each have a mesh structure including a plurality of holes respectively corresponding to the light-emission areas P-E of the pixels, as shown in the enlarged view of FIG. 10A.

Referring to FIG. 10C, the first auxiliary sensing electrode S-SP1 may be connected to the first sensing electrode SP1 via the contact hole CNT in the second insulating layer 403. Through the above configuration, resistance of the first sensing electrode SP1 may be reduced. Likewise, the second sensing electrode SP2 may be connected to the second auxiliary sensing electrode S-SP2 via the contact hole in the second insulating layer 403. The first and second insulating layers 401 and 403 may include an inorganic insulating layer or an organic insulating layer such as SiN$_x$, and the third insulating layer 405 may include an organic insulating material or an inorganic insulating material. The first and second conductive layers 410 and 420 may each include a metal layer or a transparent conductive layer. The metal layer may include Mo, Mb, Ag, Ti, Cu, Al, or an alloy thereof, and may have a single-layered or multi-layered structure including the above-stated metal. The transparent conductive layer may include a transparent conductive oxide material or graphene, as described above.

Figure 11A:
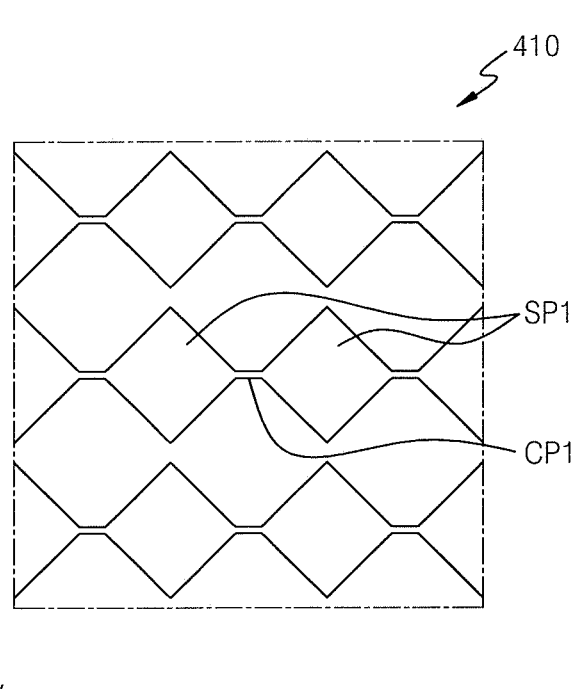
FIGS. 11A and 11B illustrate plan views of a first conductive layer and a second conductive layer in an input sensing layer according to another embodiment.
Figure 11B:
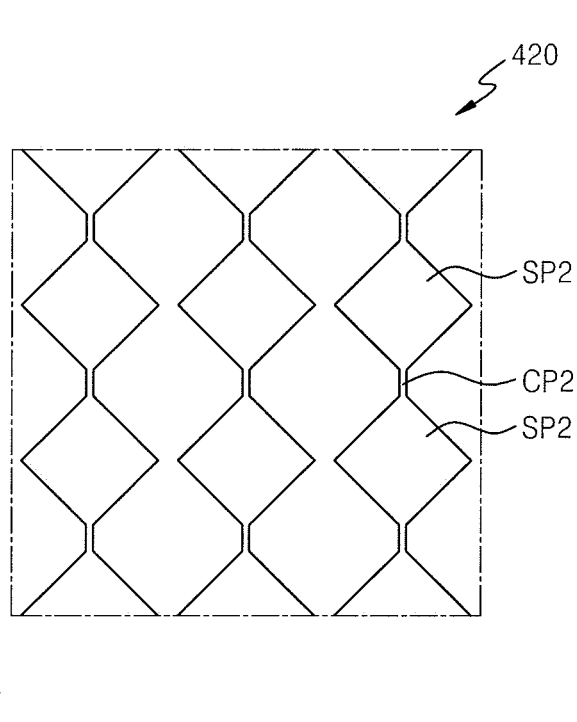
Figure 11C:
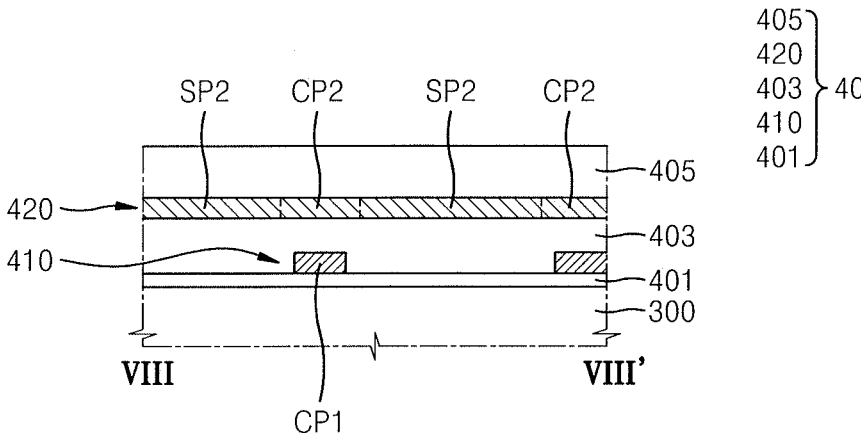
FIG. 11C is a cross-sectional view of an input sensing layer according to another embodiment.

FIGS. 11A and 11B illustrate plan views of a first conductive layer 410 and a second conductive layer 420 in an input sensing layer according to another embodiment, and FIG. 11C illustrates a cross-sectional view of the input sensing layer according to another embodiment, taken along a line VIII-VIII' of FIG. 8.

Referring to FIGS. 11A and 11B, the first conductive layer 410 may include the first sensing electrodes SP1 and the first connecting electrodes CP1 for connecting the first sensing electrodes SP1. The second conductive layer 420 may include the second sensing electrodes SP2 and the second connecting electrodes CP2 for connecting the second sensing electrodes SP2.

Referring to FIG. 11C, the second insulating layer 403 may be arranged between the first conductive layer 410 and the second conductive layer 420. The second insulating layer 403 may not include an additional contact hole, and the first and second sensing electrodes SP1 and SP2 may be electrically insulated from each other with the second insulating layer 403 provided therebetween. The second conductive layer 420 may be covered by the third insulating layer 405. The first insulating layer 401 including an inorganic material or an organic material may be further provided under the first conductive layer 410. The second and third insulating layers 403 and 405 may include organic insulating layers. In another embodiment, the second and third insulating layers 403 and 405 may include an inorganic insulating layer or both the organic and inorganic insulating layers. The first and second conductive layers 410 and 420 may each include a metal layer or a transparent conductive layer. The metal layer may include Mo, Mb, Ag, Ti, Cu, Al, or an alloy thereof, and may have a single-layered structure or a multi-layered structure including the above-stated metal. The transparent conductive layer may include a transparent conductive oxide material such as ITO, IZO, ZnO, ITZO, etc. The transparent conductive layer may include a conductive polymer such as PEDOT, metal nano-wires, graphene, etc.

Figure 12:
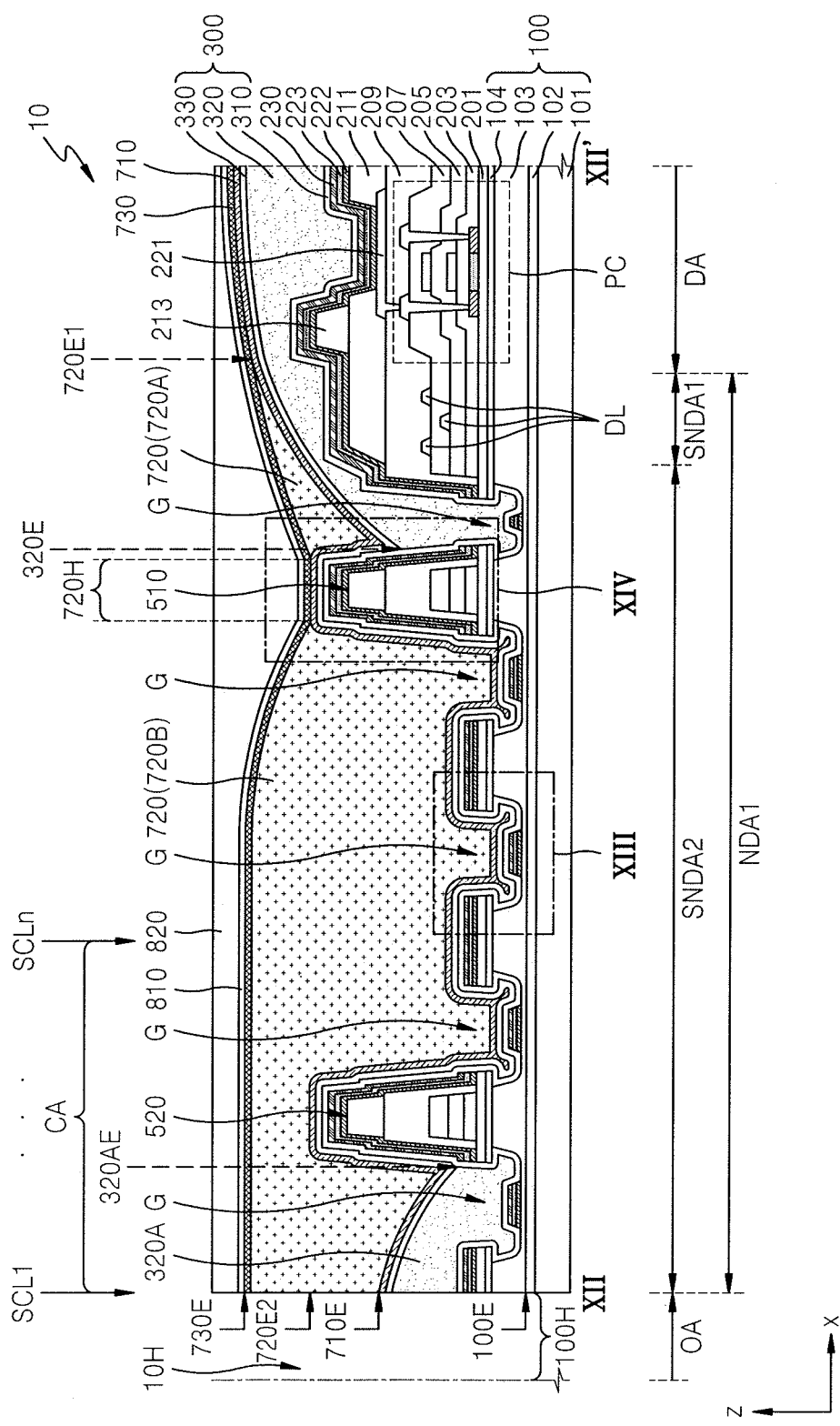
FIG. 12 illustrates a cross-sectional view of a display panel according to an embodiment.
Figure 13:
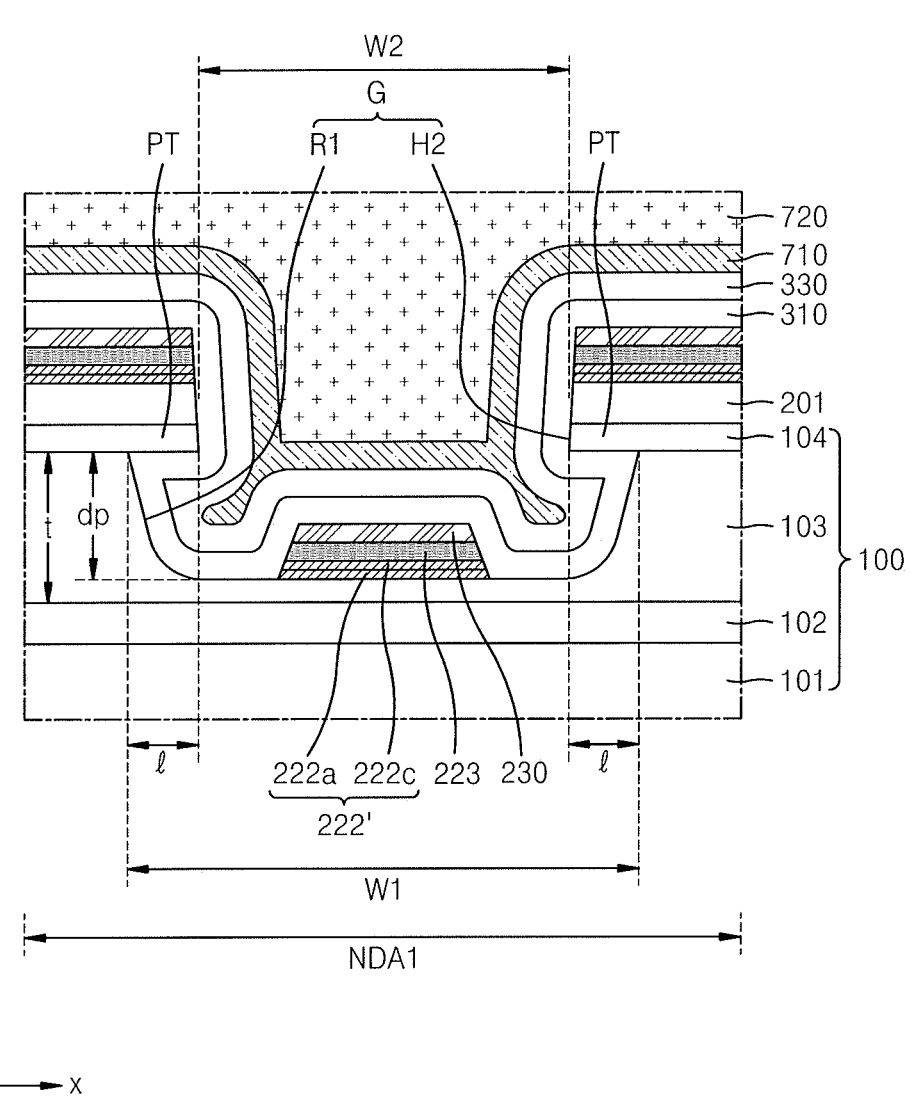
FIG. 13 illustrates a cross-sectional view of a region XIII in FIG. 12.
Figure 14:
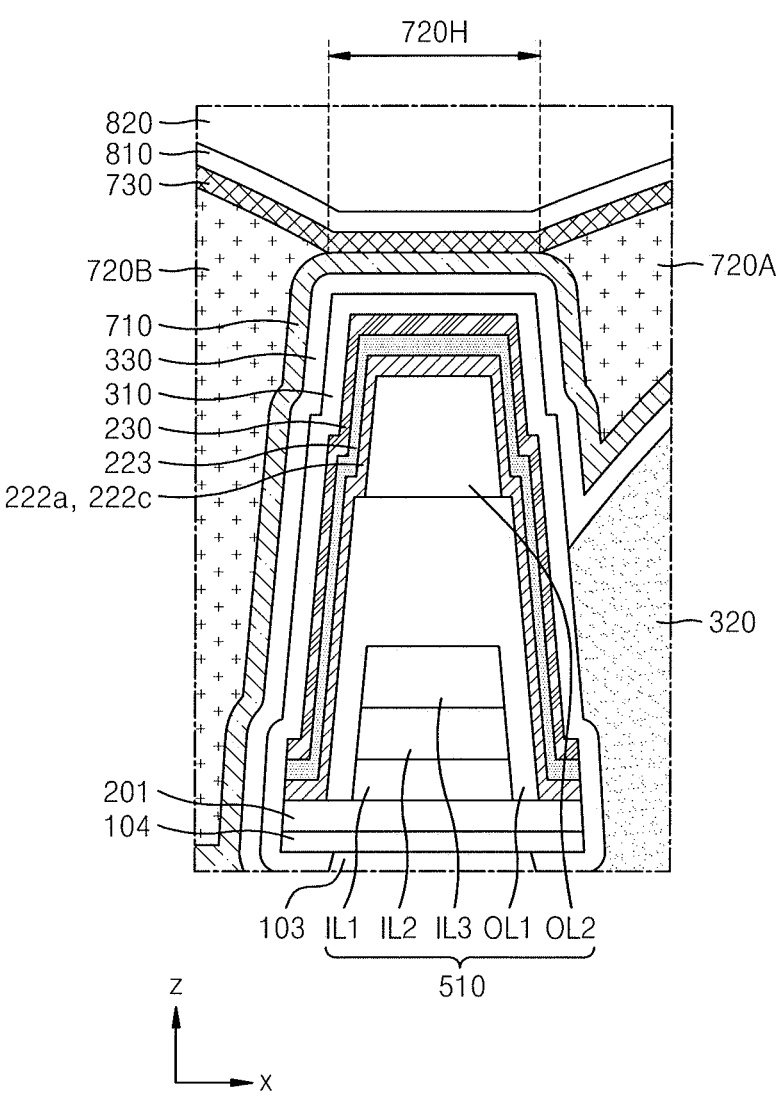
FIG. 14 illustrates a cross-sectional view of a region XIV in FIG. 12.
Figure 15:
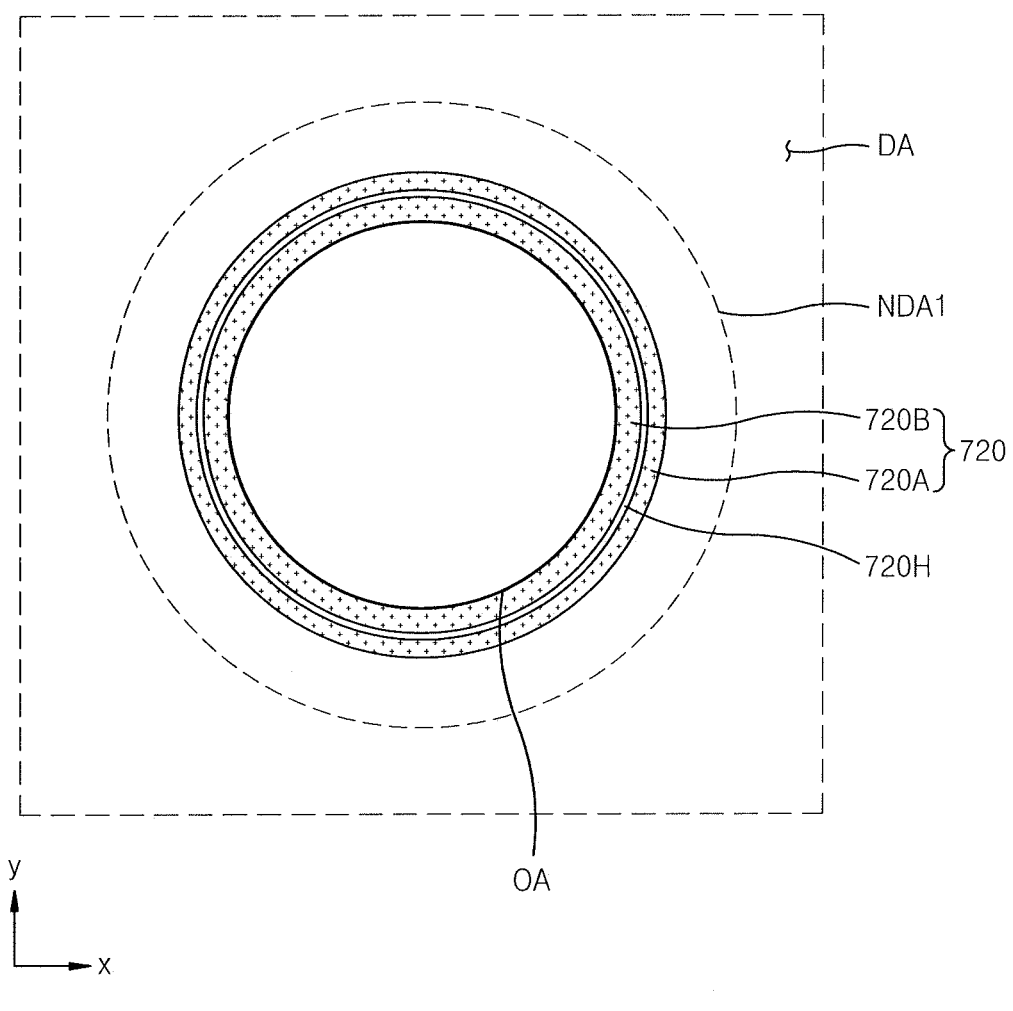
FIG. 15 illustrates a plan view partially showing a planarization layer around an opening area in a display panel according to an embodiment.
Figure 16:
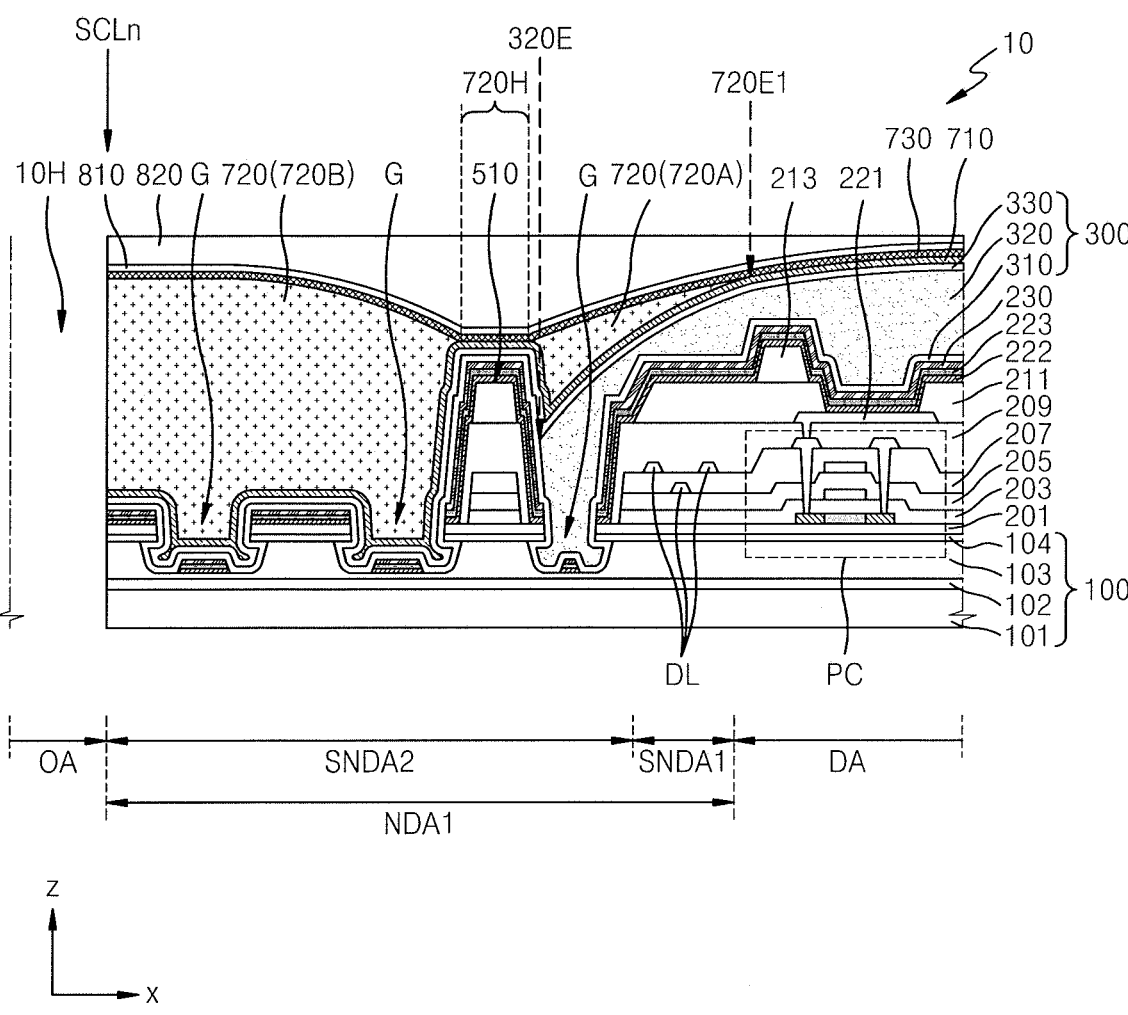
FIG. 16 illustrates a cross-sectional view of a display panel according to another embodiment.

FIG. 12 illustrates a cross-sectional view of the display panel 10 according to the embodiment, taken along a line XII-XII' of FIG. 6, FIGS. 13 and 14 illustrate cross-sectional views showing excerpts of a region XIII and a region XIV of FIG. 12, FIG. 15 illustrates a plan view of the planarization layer around the opening area OA in the display panel 10 according to the embodiment, and FIG. 16 illustrates a cross-sectional view of a display panel according to another embodiment.

Referring to FIG. 12, the display panel 10 may include the opening area OA, the display area DA, and the first non-display area NDA1 between the opening area OA and the display area DA. The display panel 10 may include a first opening 10H corresponding to the opening area OA.

In the display area DA, the pixel circuit PC on the substrate 100, the pixel electrode 221 connected to the pixel circuit PC, and the intermediate layer 222 and the opposite electrode 223 sequentially stacked on the pixel electrode 221 may be included.

The substrate 100 may have a multi-layered structure. For example, the substrate 100 may include a first base layer 101, a first barrier layer 102, a second base layer 103, and a second barrier layer 104 that are sequentially stacked in the stated order.

The first and second base layers 101 and 103 may each include a polymer resin. For example, the first and second base layers 101 and 103 may include a polymer resin such as a PES, PAR, PEI, PEN, PET, PPS, PI, PC, TAC, CAP, etc. The polymer resin may be transparent.

The first and second barrier layers 102 and 104 may help prevent infiltration of external impurities. The first and second barrier layers 102 and 104 may each have a single-layered structure or a multi-layered structure including an inorganic material such as $SiN_x$ and/or $SiO_x$.

The pixel circuit PC may be arranged on the substrate 100. The pixel circuit PC may include a thin film transistor, a storage capacitor, etc. The organic light-emitting diode OLED including the pixel electrode 221, the emission layer of the intermediate layer 222, and the opposite electrode 223 may emit predetermined light. The OLED may be covered by the thin film encapsulation layer 300. Elements arranged in the display area DA may be the same as those described above with reference to FIG. 7.

Referring to the first non-display area NDA1 of FIG. 12, the first non-display area NDA1 may include a first sub non-display area SNDA1 relatively closer to the display area DA and a second sub non-display area SNDA2 relatively closer to the opening area OA or the first opening 10H.

The first sub non-display area SNDA1 may be a region where the signal lines, e.g., the data lines DL described above with reference to FIG. 5 pass through. In this regard, the data lines DL shown in FIG. 12 may detour around the opening area OA. The first sub non-display area SNDA1 may be a wiring region or a detouring or bypassing region through which the data lines DL pass.

The data lines DL may be alternately arranged with an insulating layer provided therebetween, as shown in FIG. 12. In some implementations, the data lines DL may be arranged in the same insulating layer (e.g., the second interlayer insulating layer 207). When the data lines DL that are adjacent to each other are arranged respectively on and under the insulating layer (e.g., the second interlayer insulating layer 207), a gap (pitch) between the data lines DL adjacent to each other may be reduced and a width of the first non-display area NDA1 may be reduced. FIG. 12 shows that the data lines DL are located in the first sub non-display area SNDA1. The scan lines (SL, FIG. 5) that detour around the opening area OA as described above with reference to FIG. 5 may be located in the first sub non-display area SNDA1.

The second sub non-display area SNDA2 is a groove area in which grooves are arranged. The number of grooves may vary. For example, FIG. 12 shows five grooves located in the second sub non-display area SNDA2

Each of the grooves G may be formed in a multi-layered structure including a first layer and a second layer which have different materials from each other. For example, the grooves G may be formed in a sub-layer of the substrate 100, as shown in FIG. 12.

Referring to FIGS. 12 and 13, the grooves G may be formed by partially removing the second barrier layer 104 and the second base layer 103. A hole H2 penetrating through the second barrier layer 104 and a recess R1 formed in the second base layer 103 may be spatially connected to each other to form the groove G. The second base layer 103 may correspond to the first layer and the second barrier layer 104 may correspond to the second layer in the multi-layered structure described above.

In a process of forming the groove G, the buffer layer 201 on the second barrier layer 104 may be partially removed with the second barrier layer 104 to form the hole H2. Herein, the buffer layer 201 and the second barrier layer 104 are described as separate elements from each other, but in some implementations, the buffer layer 201 on the substrate 100 may be a sub-layer of the second barrier layer 104 having the multi-layered structure.

In the groove G, a width of a portion passing through the second barrier layer 104, e.g., the hole H2, may be less than a width of a portion passing through the second base layer 103, e.g., the recess R1. A width W2 (or diameter) of the hole H2 may be less than a width W1 (or diameter) of the recess R1, and the groove G may have an undercut cross-section.

A side surface of the second barrier layer 104, which defines the hole H2, may protrude toward a center of the groove G more than a side surface of the second base layer 103, which defines the recess R1. Protruding portions of the second barrier layer 104 toward the center of the groove G may form a pair of caves (or a pair of protruding tips or tips, PT). The buffer layer 201 may also form a pair of caves, together with the second barrier layer 104.

The groove G may be formed before forming the intermediate layer 222. A part 222' of the intermediate layer 222, e.g., first and/or second functional layers 222a and 222c extending to the first non-display area NDA1, may be disconnected in the groove G. Likewise, the opposite electrode 223 and the capping layer 230 including LiF may be disconnected in the groove G. A length ℓ of each of the pair of tips PT may be less than 2.0 μm. In one embodiment, the length ℓ may be about 1.0 μm to about 1.8 μm, or may be about 1.0 μm to about 1.5 μm.

In FIGS. 12 and 13, a bottom surface of the groove G is shown as being located on a virtual plane that is between a bottom surface and an upper surface of the second base layer 103. In some implementations, the bottom surface of the groove G may be located on the same plane as that of the bottom surface of the second base layer 103. For example, in an etching process for forming the groove G, a depth dp of the recess R1 may be substantially equal to a thickness t of the second base layer 103. In this case, the bottom surface of the groove G may be on the same plane as the bottom surface of the second base layer 103. The depth dp of the recess R1 may be equal to or greater than 2.0 μm. For example, the depth dp of the recess R1 may be equal to or greater than 2.5 μm. Or The depth dp of the recess R1 may be equal to or greater than 3.0 μm. When the depth dp of the recess R1 is equal to the thickness t of the second base layer 103, the recess R1 may be a hole that penetrates through the second base layer 103.

The thin film encapsulation layer 300 may extend to cover the first non-display area NDA1 as shown in FIG. 12. For example, the first and second inorganic encapsulation layers 310 and 330 may extend to the first non-display area NDA1. The first and second inorganic encapsulation layers 310 and 330 may be formed by chemical vapor deposition (CVD), etc. and may have a step coverage that is relatively superior to that of the part 222' in the intermediate layer 222 or the opposite electrode 223. Therefore, the first and second inorganic encapsulation layers 310 and 330 may be continuously formed without being disconnected in the groove G. The first inorganic encapsulation layer 310 may cover an inner surface of the groove G. The first and second inorganic encapsulation layers 310 and 330 may have different thickness from each other. For example, the first inorganic encapsulation layer 310 may have a thickness of about 1 µm and the second inorganic encapsulation layer 330 may have a thickness of about 0.7 µm. For example, the thickness of the second inorganic encapsulation layer 310 may be less than that of the first inorganic encapsulation layer 310.

FIGS. 12 and 13 show a structure in which the capping layer 230 including LiF is disconnected in the groove G. In some implementations, when the capping layer 230 includes an inorganic material such as $SiN_x$, $SiO_x$, and SiON, the capping layer 230 may continuously cover the inner surface of the groove G without being disconnected in the groove G, similar to the first inorganic encapsulation layer 310.

As shown in FIG. 12, the organic encapsulation layer 320 may cover the display area DA, and an end 320E thereof may be located at one side of a first barrier wall 510. The organic encapsulation layer 320 may be formed by applying a monomer and hardening the monomer. A flow of the monomer may be controlled by the first barrier wall 510 and a thickness of the organic encapsulation layer 320 may be also controlled by the organic encapsulation layer 320. When the organic encapsulation layer 320, e.g., the end 320E of the organic encapsulation layer 320, is spaced apart from the opening area OA, external moisture infiltrating through the first opening 10H may not proceed to the organic light-emitting diode OLED in the display area DA.

An organic material layer 320A may be spaced a predetermined distance from the organic encapsulation layer 320 and may be arranged adjacent to the opening area OA and/or the first opening 10H. The organic material layer 320A may be formed in the same process as that of forming the organic encapsulation layer 320 and may include the same material as that of the organic encapsulation layer 320. Similarly, the flow of monomer may be controlled by the first barrier wall 510 in the process of forming the organic encapsulation layer 320. The organic material layer 320A may be adjusted by a second barrier wall 520, and an end 320AE of the organic material layer 320A may be located at one side of the second barrier wall 520. As shown in FIG. 12, the first inorganic encapsulation layer 310 and the second inorganic encapsulation layer 330 may be located on the first non-display area NDA1 in contact with each other. If a contact area between the first inorganic encapsulation layer 310 and the second inorganic encapsulation layer 330 were to be equal to or greater than a certain value, the first and second inorganic encapsulation layers 310 and 330 or adjacent layers, e.g., a planarization layer 720 that will be described later, could be lifted due to the stress on the first and second inorganic encapsulation layers 310 and 330. However, according to the embodiment, the organic material layer 320A may be arranged between the first and second inorganic encapsulation layers 310 and 330, and thus the above-described lifting of layers may be avoided. When the organic material layer 320A is located apart from the organic encapsulation layer 320, the first inorganic encapsulation layer 310 and the second inorganic encapsulation layer 330 may contact each other in an area (or region) between the end 320E of the organic encapsulation layer 320 and an end 320AE of the organic material layer 320A.

The planarization layer 720 may be arranged in the first non-display area NDA1. The planarization layer 720 may include an organic insulating layer. The planarization layer 720 may include a polymer-based material. For example, the planarization layer 720 may include a silicon-based resin, an acryl-based resin, an epoxy-based resin, PI, polyethylene, etc. The polymer-based material may be transparent. In one embodiment, the planarization layer 720 may include a material different from that included in the organic encapsulation layer 320. For example, the organic encapsulation layer 320 may include a silicon-based resin, and the planarization layer 720 may include an acryl-based resin. In another embodiment, the organic encapsulation layer 320 and the planarization layer 720 may include the same material.

The planarization layer 720 may cover at least one groove G located in the first non-display area NDA1. The planarization layer 720 may at least cover a region of the first non-display area NDA1 that is not covered by the organic encapsulation layer 320, to increase flatness of the display panel 10 around the opening area OA. Therefore, separation or lifting-off of the input sensing layer 40 (see FIG. 2) and/or the optical functional layer 50 (see FIG. 2) arranged on the display panel 10 may be minimized or prevented. The planarization layer 720 may partially overlap the organic encapsulation layer 320. An end of the planarization layer 720, e.g., a first end 720E1 that is adjacent to the display area DA, may be located on the organic encapsulation layer 320 in the first non-display area NDA1. The first end 720E1 of the planarization layer 720 may be closer to the opening area OA than a light-emitting area (e.g., opening of the pixel defining layer) of a pixel that is closest to the first non-display area NDA1. Regarding this, FIG. 12 shows that the first end 720E1 of the planarization layer 720 may be located between the first sub non-display area SNDA1 and the light-emitting area of the pixel closest to the first non-display area NDA1. In some implementations, the first end 720E1 of the planarization layer 720 may be located in the first sub non-display area SNDA1 so that the planarization layer 720 may partially cover the data lines DL located in the first sub non-display area SNDA1. In some implementations, the first end 720E1 of the planarization layer 720 may be located between the first sub non-display area SNDA1 and the second sub non-display area SNDA2 so as not to cover the data lines DL located in the first sub non-display area SNDA1.

The planarization layer 720 may be formed on the first non-display area NDA1 through exposure and development processes, etc. In some of the processes for forming the planarization layer 720 (e.g., cleaning processes), if external impurities, e.g., moisture, were to proceed in a lateral direction (e.g., a direction parallel to an xy plane) of the display panel 10, the organic light-emitting diode OLED of the display area DA could be damaged. However, according to the one or more embodiments, the first inorganic insulating layer 710 and the second inorganic insulating layer 730 may be arranged under and on the planarization layer 720, and thus, moisture infiltration during and after the process of forming the planarization layer 720 may be prevented or minimized.

The first inorganic insulating layer 710 may be located directly under the planarization layer 720, and the second inorganic insulating layer 730 may be located directly on the planarization layer 720. Each of the first inorganic insulating layer 710 and the second inorganic insulating layer 730 may include an inorganic insulating material such as $SiO_x$, $SiN_x$, and SION. The first inorganic insulating layer 710 and the second inorganic insulating layer 730 may include the same material as each other or different materials from each other. The second inorganic insulating layer 730 may have a thickness that is greater than that of the first inorganic insulating layer 710. In some implementations, the thickness of the second inorganic insulating layer 730 may be equal to or less than that of the first inorganic insulating layer 710.

The first inorganic insulating layer 710 may directly contact the thin film encapsulation layer 300. For example, the first inorganic insulating layer 710 may directly contact an upper surface of the second inorganic encapsulation layer 330. The first inorganic insulating layer 710 may include a material that is the same as or different from that of the second inorganic encapsulation layer 330. In one embodiment, the first inorganic insulating layer 710 and the second inorganic encapsulation layer 330 may include the same material, e.g., $SiN_x$. Even when the first inorganic insulating layer 710 and the second inorganic encapsulation layer 330 both include $SiN_x$, the first inorganic insulating layer 710 and the second inorganic encapsulation layer 330 may be respectively formed in separate processes, and detailed composition ratios thereof (e.g., content ratio between silicon and nitrogen) may vary. An interface may be between the first inorganic insulating layer 710 and the second inorganic encapsulation layer 330. The first inorganic insulating layer 710 may have a thickness that is less than that of the second inorganic encapsulation layer 330.

The planarization layer 720 may include a first portion 720A and a second portion 720B that are separated from each other based on the first barrier wall 510. Referring to FIGS. 12 and 14, when the first portion 720A and the second portion 720B are separated from each other, the planarization layer 720 may include a hole 720H between the first portion 720A and the second portion 720B. When the planarization layer 720 includes the hole 720H, a contact region between inorganic insulating materials may be generated partially in the first non-display area NDA1. For example, on the first barrier wall 510 corresponding to the hole 720H of the planarization layer 720, the first inorganic encapsulation layer 310, the second inorganic encapsulation layer 330, the first inorganic insulating layer 710, and the second inorganic insulating layer 730 may be sequentially stacked in contact with one another.

The first barrier wall 510 may include multiple layers. For example, as shown in FIG. 14, the first barrier wall 510 may include inorganic layers IL1, IL2, and IL3, and organic layers OL1 and OL2. The organic layers OL1 and OL2 may entirely cover the inorganic layers IL1, IL2, and IL3. For example, the organic layers OL1 and OL2 may cover upper and side surfaces of a stack of the inorganic layers IL1, IL2, and IL3. The inorganic layers IL1, IL2, and IL3 may respectively include materials that are the same as those of the gate insulating layer 203, the first interlayer insulating layer 205, and the second interlayer insulating layer 207. The organic layers OL1 and OL2 may respectively include materials that are the same as those of the planarized insulating layer 209 and the pixel defining layer 211. some implementations, the number of layers included in the first barrier wall 510 may be greater than or less than the number of layers shown in FIG. 14.

A first upper insulating layer 810 and a second upper insulating layer 820 may be arranged on the second inorganic insulating layer 730. The second upper insulating layer 820 may include a material that is the same as that of the third insulating layer 405 in the input sensing layer 40 described above with reference to FIGS. 8 to 11C. The second upper insulating layer 820 may be integrally formed with the third insulating layer 405. The first upper insulating layer 810 may include the same material as that of the second insulating layer 403 in the input sensing layer 40 and may be integrally formed with the second insulating layer 403. In an embodiment, the first upper insulating layer 810 may include an inorganic insulating material and the second upper insulating layer 820 may include an organic insulating material. The second inorganic insulating layer 730 may be integrally formed with the substrate 100 to cover the display area DA and the first non-display area NDA1. The second inorganic insulating layer 730 may be considered as a part of the second insulating layer 403 including a plurality of sub-layers. The first inorganic insulating layer 710 arranged under the second inorganic insulating layer 730 may include the same material as that of the first insulating layer 401 in the input sensing layer 40 and may be integrally formed with the first insulating layer 401. According to an embodiment, the second inorganic insulating layer 730 and the first upper insulating layer 810 may be formed integrally with the sub-layers of the second insulating layer 403 in the input sensing layer 40, and the first inorganic insulating layer 710 may be integrally formed with the first insulating layer 401 of the input sensing layer 40. In this case, the second inorganic insulating layer 730 and the first upper insulating layer 810 may include materials that are different from or the same as each other. Even when the second inorganic insulating layer 730 and the first upper insulating layer 810 include the same material (e.g., $SiN_x$), the second inorganic insulating layer 730 and the first upper insulating layer 810 may be formed in separate processes. Therefore, the second inorganic insulating layer 730 and the first upper insulating layer 810 may have different composition ratios between silicon and nitrogen and may have an interface therebetween. In some implementations, the first upper insulating layer 810 may be integrally formed with the second insulating layer 403 of the input sensing layer 40, and the second inorganic insulating layer 730 may be integrally formed with the first insulating layer 401 of the input sensing layer 40.

The cross-sectional structure shown in FIG. 12 may be appreciated as a structure surrounding the first opening 10H and the opening area OA. For example, the grooves G between the opening area OA and the display area DA may have loop shapes surrounding the first opening 10H and the opening area OA, as described above with reference to FIG. 6. Likewise, the planarization layer 720 of FIG. 12 may have a loop shape surrounding the first opening 10H and the opening area OA, as shown in FIG. 15.

Referring to FIG. 15, the planarization layer 720 may have a loop shape surrounding the opening area OA. The hole 720H of the planarization layer 720 also has a loop shape surrounding the first opening 10H and the opening area OA, and the first portion 720A and the second portion 720B separated from each other based on the hole 720H may each have a loop shape. The first and second barrier walls 510 and 520 may also have the loop shapes surrounding the first opening 10H and the opening area OA.

The first opening 10H of the display panel 10 may be formed by performing a cutting or scribing process after forming the above-stated components and the layers on the substrate 100. For example, the cross-sectional structure of FIG. 12 may be understood as a cross-section of the display panel 10 manufactured by performing a cutting or scribing process along a first line SCL1. End portions of the layers on the substrate 100 may be located on the same vertical line as that of an end 100E of the substrate 100, wherein the end 100E defines the first opening 10H. For example, an end 710E of the first inorganic insulating layer 710, a second end 720E2 of the planarization layer 720, and an end 730E of the second inorganic insulating layer 730 may be located on the same vertical line as that of an end 100E of the substrate 100, which defines an opening 100H in the substrate 100. Likewise, ends of the first and second inorganic encapsulation layers 310 and 330, the organic material layer 320A, and the first and second upper insulating layers 810 and 820 may be located on the same vertical line as that of the end 100E of the substrate 100.

A region from the first line SCL1 to an n-th line SCLn shown in FIG. 12 may be appreciated as a region CA, in which the cutting or scribing process is performed during manufacturing of the display panel. That is, the cutting or scribing process may be performed along one of the first to n-th lines SCL1 to SCLn, and a cross-sectional structure thereof may correspond to the structure of the display panel according to the embodiment(s). FIG. 16 may correspond to a cross-sectional structure of the display panel 10, on which the cutting or scribing process is performed along the n-th line SCLn.

Figure 17:
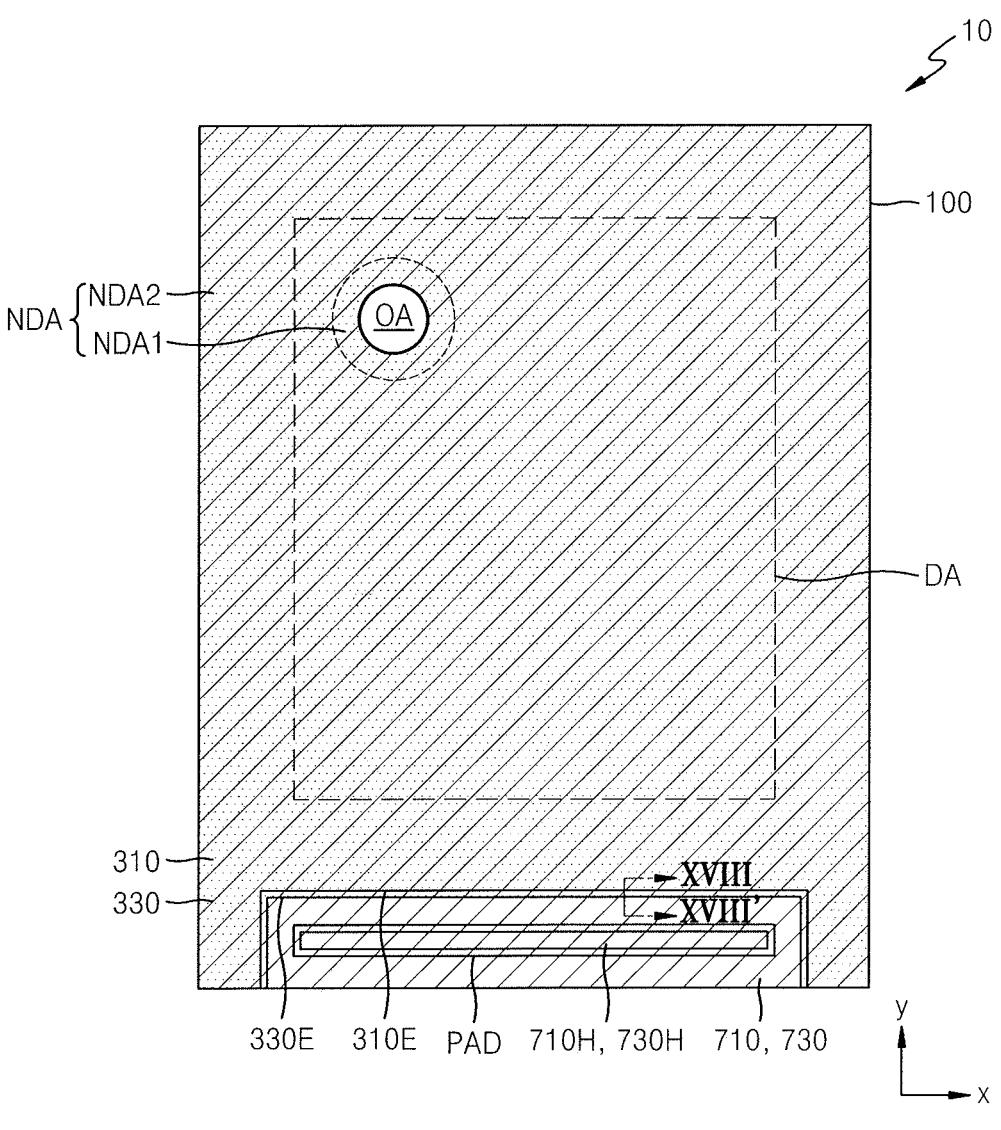
FIG. 17 illustrates a plan view of first and second inorganic encapsulation layers and first and second inorganic insulating layers in a display panel according to an embodiment.
Figure 18:
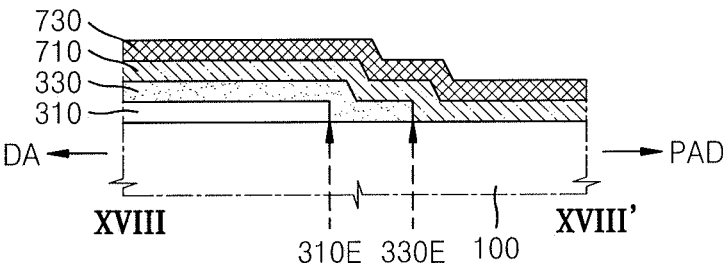
FIG. 18 illustrates a cross-sectional view taken along a line XVII-XVII' of FIG. 17.

FIG. 17 illustrates a plan view showing the first and second inorganic encapsulation layers 310 and 330 and the first and second inorganic insulating layers 710 and 730 in the display panel 10 according to the embodiment. FIG. 18 illustrates a cross-sectional view taken along a line XVIII-XVIII' of FIG. 17.

Referring to FIG. 17, the first and second inorganic encapsulation layers 310 and 330 may be located on the substrate 100 and may entirely cover the display area DA. Also, as described above with reference to FIG. 12, etc., the first and second inorganic encapsulation layers 310 and 330 may entirely cover the first non-display area NDA1 and may partially cover the second non-display area NDA2. On the plane of FIG. 17, the first and second inorganic encapsulation layers 310 and 330 may include edges located on the substantially same vertical lines as those of a left edge, a right edge, and an upper edge of the substrate 100. Edges 310E and 330E of the first and second inorganic encapsulation layers 310 and 330, which are adjacent to a pad portion PAD, may be spaced a predetermined distance from the pad portion PAD. For example, the edges 310E and 330E of the first and second inorganic encapsulation layers 310 and 330 may partially surround the pad portion PAD.

The first and second inorganic insulating layers 710 and 730 may entirely cover the display area DA and the first non-display area NDA1 of the substrate 100 and may partially cover the second non-display area NDA2. An area of a portion in the second non-display area NDA2 where the portion is covered by the first and second inorganic insulating layers 710 and 730, may be greater than that of a portion in the second non-display area NDA2, where the portion is covered by the first and second inorganic encapsulation layers 310 and 330. In one embodiment, the edges 310E and 330E of the first inorganic encapsulation layers 310 and 330 adjacent to the pad portion PAD may be respectively spaced a predetermined distance from the pad portion PAD, but the first and second inorganic insulating layers 710 and 730 may cover a remaining portion of the second non-display area NDA2, except for holes 710H and 730H, which expose a plurality of pads included in the pad portion PAD. Referring to FIG. 18, the first and second inorganic insulating layers 710 and 730 may further extend toward the pad portion PAD beyond the edges 310E and 330E of the first and second inorganic encapsulation layers 310 and 330. When the first and second inorganic insulating layers 710 and 730 further extend as described above, impurities such as moisture may be hindered or prevented from proceeding towards the display area DA along a direction in parallel with the upper surface of the substrate 100 during some of the processes (e.g., cleaning process) of forming the planarization layer 720 described above with reference to FIG. 12.

Figure 19:
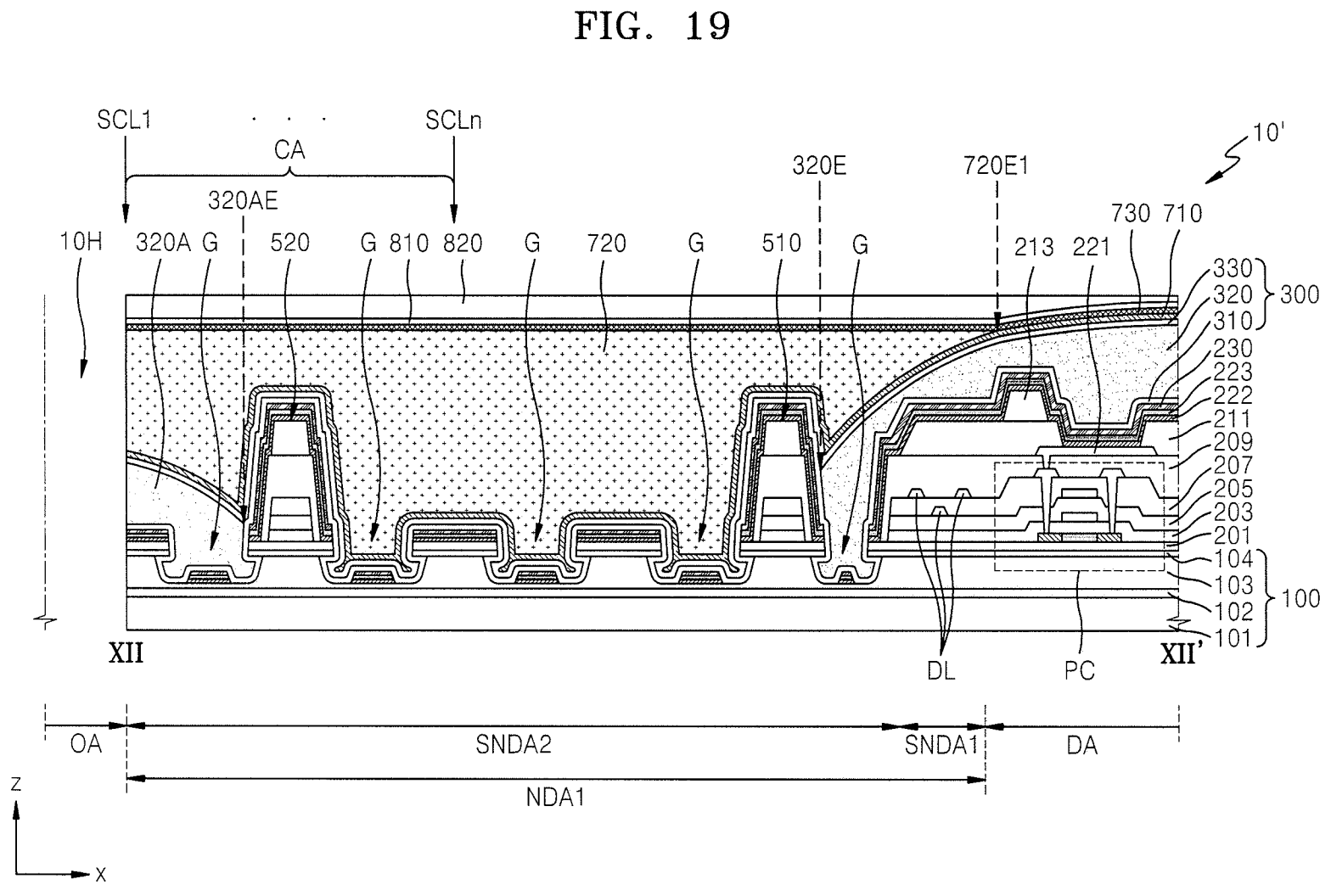
Figure 20:
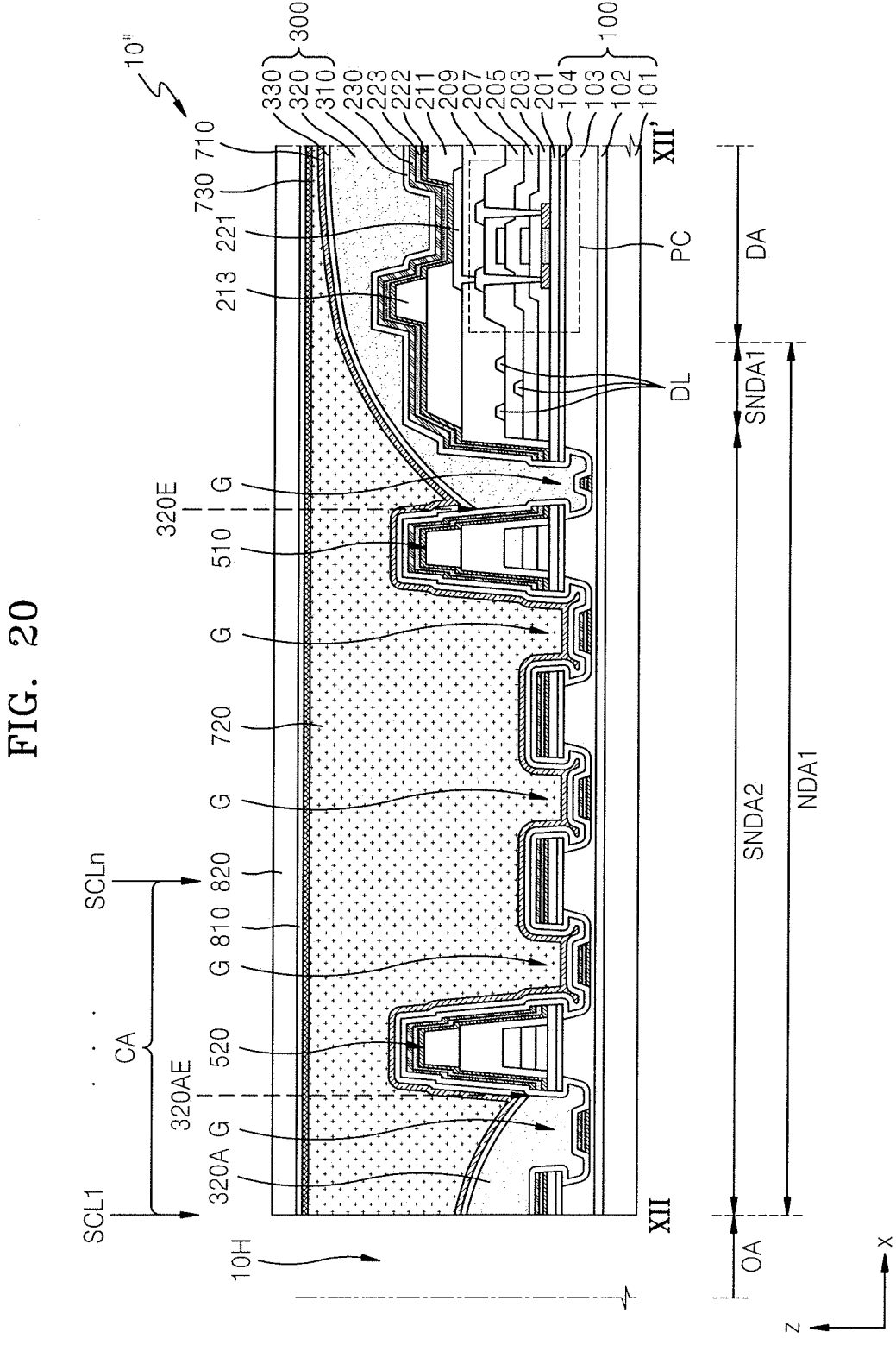

FIGS. 19 and 20 illustrate cross-sectional views of display panels 10' and 10" according to other embodiments. In the above description with reference to FIG. 12, the planarization layer 720 may include the hole 720H and may be arranged as an island in the first non-display area NDA1. In the display panels 10' and 10" of FIGS. 19 and 20, components except for the structure of the planarization layer 720 are the same as those of FIG. 12, and hereinafter differences will be described.

Referring to FIG. 19, the planarization layer 720 may be arranged in the first non-display area NDA1 and may not include a hole. For example, the planarization layer 720 may entirely cover the first non-display area NDA1. The first inorganic insulating layer 710 and the second inorganic insulating layer 730 may not contact each other in the first non-display area NDA1. For example, since the planarization layer 720 having a loop shape may be located in the first non-display area NDA1 similar to the example illustrated with reference to FIG. 15, the first inorganic insulating layer 710 and the second inorganic insulating layer 730 may contact each other in a region where the planarization layer 720 is not arranged. When the first inorganic insulating layer 710 and the second inorganic insulating layer 730 cover the display area DA and the second non-display area NDA2 as described above with reference to FIG. 17, the first inorganic insulating layer 710 and the second inorganic insulating layer 730 may contact each other in the display area DA and/or the second non-display area NDA2. In some implementations, when a first end 720E1 of the planarization layer 720 is located in the second sub non-display area SNDA2, the first inorganic insulating layer 710 and the second inorganic insulating layer 730 may contact each other in the first sub non-display area SNDA1.

In FIGS. 12 to 19, the planarization layer 720 may be arranged in the first non-display area NDA1. In some implementations, the planarization layer 720 may extend to the display area DA as shown in FIG. 20. The planarization layer 720 may include a polymer-based transparent material. In this case, the first inorganic insulating layer 710 and the second inorganic insulating layer 730 may not contact each other in the first non-display area NDA1 and the display area DA, but only contact each other in the second non-display area NDA2.

Cross-sectional structures respectively shown in FIGS. 19 and 20 may be understood as cross-sections of the display panels 10' and 10" manufactured by performing the cutting or scribing process along the first line SCL1. In another embodiment, a region from the first line SCL1 to the n-th line SCLn shown in FIGS. 19 and 20 may correspond to a region CA in which the cutting or scribing process is performed during processes of manufacturing the display panel. T the cutting or scribing process may be performed along one of the first to n-th lines SCL1 to SCLn, and the cross-sectional structure according to the process may correspond to the structure of the display panel according to the embodiment(s).

By way of summation and review, in a display apparatus, various functions attached to or linked to the display apparatus may be added while increasing a display area. In order to add various functions to a display apparatus while increasing the display area, an opening may be provided in a display area. However, there is a risk that in a display apparatus including an opening, a film or a layer may be lifted or separated around the opening according to structures of the opening and elements arranged around the opening.

One or more embodiments include a display panel, in which an opening having an improved quality is provided, One or more embodiments provide the display panel and apparatus including the opening area and/or an opening. The display panel and apparatus may protect display elements against the moisture infiltrating along a direction parallel to the upper surface of the substrate in the display panel (for example, in a lateral direction).

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof the present invention.

What is claimed is:

1. An electronic device comprising:
a display panel comprising an opening area and a display area surrounding the opening area; and
a component corresponding to the opening area of the display panel,
wherein the display panel comprises:
a substrate having an opening in the opening area;
a plurality of pixel electrodes arranged in the display area;
an opposite electrode overlapping the plurality of pixel electrodes in the display area;
an intermediate layer between the plurality of pixel electrodes and the opposite electrode;
an encapsulation layer on the opposite electrode, the encapsulation layer comprising a first inorganic encapsulation layer, a second inorganic encapsulation layer, and an organic encapsulation layer between the first inorganic encapsulation layer and the second inorganic encapsulation layer;
a first inorganic insulating layer on the encapsulation layer;
a plurality of touch electrodes on the first inorganic insulating layer, the plurality of touch electrodes being arranged in the display area;
a barrier wall in a non-display area, the non-display area being between the opening area and the display area; and
an organic insulation layer disposed on an upper surface of the first inorganic insulating layer in the non-display area, wherein
the first inorganic insulating layer and the second inorganic encapsulation layer each extend to the non-display area,
on an upper surface of the barrier wall, the first inorganic insulating layer is in direct contact with the second inorganic encapsulation layer,
a contact area of the first inorganic insulating layer and the second inorganic encapsulation layer is overlapped by the organic insulation layer,
the organic insulation layer does not overlap the display area in plan view, and the barrier wall completely surrounds the opening in plan view.

2. The electronic device of claim 1, wherein
the first inorganic encapsulation layer extends to the non-display area, and
on the barrier wall, the second inorganic encapsulation layer is in direct contact with the first inorganic encapsulation layer.

3. The electronic device of claim 1, wherein
an upper surface of the organic insulation layer is substantially flat.

4. The electronic device of claim 1, further comprising a second inorganic insulating layer on the organic insulation layer.

5. The electronic device of claim 1, wherein
the organic insulation layer overlaps a part of the organic encapsulation layer in the non-display area.

6. The electronic device of claim 5, wherein the overlapping region of the organic insulation layer and the organic encapsulation layer is only between the barrier wall and the display area.

7. The electronic device of claim 1, wherein
the display panel further comprises a groove in the non-display area,
the groove is overlapped by the organic insulation layer, and
the groove completely surrounds the opening in plan view.

8. The electronic device of claim 7, wherein the second inorganic encapsulation layer and the first inorganic encapsulation layer are in direct contact with each other between a bottom surface of the groove and the organic insulation layer.

9. The electronic device of claim 8, wherein the groove is between the barrier wall and the opening of the substrate.

10. The electronic device of claim 1, wherein the component comprises a camera or a sensor.

11. An electronic device, comprising:
a display panel comprising an opening area and a display area at least partially surrounding the opening area; and
a component corresponding to the opening area of the display panel,
wherein the display panel comprises:
a substrate having an opening in the opening area;
a plurality of pixel electrodes arranged in a display area, the display area surrounding the opening area;
an opposite electrode overlapping the plurality of pixel electrodes in the display area;
an intermediate layer between the plurality of pixel electrodes and the opposite electrode;
an encapsulation layer on the opposite electrode, the encapsulation layer comprising a first inorganic encapsulation layer, a second inorganic encapsulation layer, and an organic encapsulation layer between the first inorganic encapsulation layer and the second inorganic encapsulation layer;
a first inorganic insulating layer on the encapsulation layer;
a plurality of touch electrodes on the first inorganic insulating layer, the plurality of touch electrodes being arranged in the display area;
at least two grooves in a non-display area, the non-display area being between the opening area and the display area; and
an organic insulating layer, wherein
in a first region between the at least two grooves, the organic insulating layer overlaps the first inorganic insulating layer, the second inorganic encapsulation layer, and the first inorganic encapsulation layer, in the first region, the first inorganic insulating layer is in direct contact with an upper surface of the second inorganic encapsulation layer, the organic insulating layer does not overlap the display area in plan view, and the display area completely surrounds the opening in plan view.

12. The electronic device of claim 11, wherein, in the first region, the organic insulating layer is in direct contact with the first inorganic insulating layer, and the second inorganic encapsulation layer is in direct contact with the first inorganic encapsulation layer.

13. An electronic device, comprising:

a display panel comprising an opening area and a display area at least partially surrounding the opening area; and a component corresponding to the opening area of the display panel, wherein the display panel comprises:

a substrate having an opening in the opening area;

a plurality of pixel electrodes arranged in a display area, the display area surrounding the opening area;

an opposite electrode overlapping the plurality of pixel electrodes in the display area;

an intermediate layer between the plurality of pixel electrodes and the opposite electrode;

an encapsulation layer on the opposite electrode, the encapsulation layer comprising a first inorganic encapsulation layer, a second inorganic encapsulation layer, and an organic encapsulation layer between the first inorganic encapsulation layer and the second inorganic encapsulation layer;

a first inorganic insulating layer on the encapsulation layer;

a plurality of touch electrodes on the first inorganic insulating layer, the plurality of touch electrodes being arranged in the display area;

at least two grooves in a non-display area, the non-display area being between the opening area and the display area; and an organic insulating layer, wherein in a first region between the at least two grooves, the organic insulating layer overlaps the first inorganic insulating layer, the second inorganic encapsulation layer, and the first inorganic encapsulation layer, in the first region, the first inorganic insulating layer is in direct contact with an upper surface of the second inorganic encapsulation layer, the intermediate layer comprises an organic layer, and the organic layer comprises a first portion, a second portion, and a third portion that are separated from each other, the first portion of the organic layer is on a bottom surface of a first groove of the at least two grooves, the second portion of the organic layer is on a bottom surface of a second groove of the at least two grooves, and the third portion of the organic layer is in the first region.

14. The electronic device of claim 13, wherein the third portion of the organic layer is below the first inorganic encapsulation layer.

15. The electronic device of claim 13, wherein the opposite electrode comprises a first portion, a second portion, and a third portion that are separated from each other, and the first portion of the opposite electrode is on the bottom surface of the first groove, the second portion of the opposite electrode is on the bottom surface of the second groove, and the third portion of the opposite electrode is in the first region.

16. The electronic device of claim 15, wherein the third portion of the opposite electrode is below the first inorganic encapsulation layer.

17. The electronic device of claim 13, wherein a first vertical distance from a bottom surface of the substrate to a bottom surface of the first portion of the organic layer is less than a second vertical distance from the bottom surface of the substrate to a bottom surface of the third portion of the organic layer.

18. The electronic device of claim 11, further comprising a barrier wall in a non-display area.

19. The electronic device of claim 18, wherein the barrier wall is overlapped by the organic insulating layer.

20. The electronic device of claim 11, further comprising a second inorganic insulating layer on the organic insulating layer.

21. The electronic device of claim 20, wherein, in the non-display area, the second inorganic insulating layer is separated from the first inorganic insulating layer by the organic insulating layer.

22. The electronic device of claim 11, wherein the component comprises a camera or a sensor.

* * * * *